(12) United States Patent
Guo et al.

(10) Patent No.: US 12,106,938 B2
(45) Date of Patent: Oct. 1, 2024

(54) DISTORTION CURRENT MITIGATION IN A RADIO FREQUENCY PLASMA PROCESSING CHAMBER

(71) Applicant: Applied Materials, Inc., Santa Clara, CA (US)

(72) Inventors: Yue Guo, Redwood City, CA (US); Yang Yang, San Diego, CA (US); Kartik Ramaswamy, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 17/475,223

(22) Filed: Sep. 14, 2021

(65) Prior Publication Data
US 2023/0087307 A1   Mar. 23, 2023

(51) Int. Cl.
*H01J 37/32* (2006.01)

(52) U.S. Cl.
CPC .. *H01J 37/32183* (2013.01); *H01J 37/32146* (2013.01); *H01J 37/32165* (2013.01); *H01J 37/3299* (2013.01); *H01J 2237/334* (2013.01)

(58) Field of Classification Search
CPC .......... H01J 37/32183; H01J 37/32146; H01J 37/32165; H01J 37/3299; H01J 2237/334
See application file for complete search history.

(56) References Cited

U.S. PATENT DOCUMENTS

| | | |
|---|---|---|
| 4,070,589 A | 1/1978 | Martinkovic |
| 4,340,462 A | 7/1982 | Koch |
| 4,464,223 A | 8/1984 | Gorin |
| 4,504,895 A | 3/1985 | Steigerwald |
| 4,585,516 A | 4/1986 | Corn et al. |

(Continued)

FOREIGN PATENT DOCUMENTS

| | | |
|---|---|---|
| CN | 101990353 A | 3/2011 |
| CN | 102084024 A | 6/2011 |

(Continued)

OTHER PUBLICATIONS

International Search Report / Written Opinion Issued to PCT/US2022/040357 dated Nov. 21, 2022.

(Continued)

*Primary Examiner* — Henry Luong
(74) *Attorney, Agent, or Firm* — Patterson & Sheridan LLP

(57) ABSTRACT

Embodiments provided herein generally include apparatus, plasma processing systems and methods for distortion current mitigation. An example plasma processing system includes a voltage source coupled to an input node, which is coupled to an electrode disposed within a processing chamber, wherein the voltage source is configured to generate a pulsed voltage signal at the input node; a signal generator having an output, wherein the RF signal generator is configured to deliver a first RF signal at a first RF frequency to the input node; a bandpass filter coupled between the output of the signal generator and the input node, wherein the bandpass filter is configured to attenuate second RF signals that are outside a range of frequencies including the first RF frequency of the first RF signal; and an impedance matching circuit coupled between the bandpass filter and the input node.

19 Claims, 9 Drawing Sheets

(56) References Cited

U.S. PATENT DOCUMENTS

| | | |
|---|---|---|
| 4,683,529 A | 7/1987 | Bucher, II |
| 4,931,135 A | 6/1990 | Horiuchi et al. |
| 4,992,919 A | 2/1991 | Lee et al. |
| 5,099,697 A | 3/1992 | Agar |
| 5,140,510 A | 8/1992 | Myers |
| 5,242,561 A | 9/1993 | Sato |
| 5,449,410 A | 9/1995 | Chang et al. |
| 5,451,846 A | 9/1995 | Peterson et al. |
| 5,464,499 A | 11/1995 | Moslehi et al. |
| 5,554,959 A | 9/1996 | Tang |
| 5,565,036 A | 10/1996 | Westendorp et al. |
| 5,595,627 A | 1/1997 | Inazawa et al. |
| 5,597,438 A | 1/1997 | Grewal et al. |
| 5,610,452 A | 3/1997 | Shimer et al. |
| 5,698,062 A | 12/1997 | Sakamoto et al. |
| 5,716,534 A | 2/1998 | Tsuchiya et al. |
| 5,770,023 A | 6/1998 | Sellers |
| 5,796,598 A | 8/1998 | Nowak et al. |
| 5,810,982 A | 9/1998 | Sellers |
| 5,830,330 A | 11/1998 | Lantsman |
| 5,882,424 A | 3/1999 | Taylor et al. |
| 5,928,963 A | 7/1999 | Koshiishi |
| 5,933,314 A | 8/1999 | Lambson et al. |
| 5,935,373 A | 8/1999 | Koshimizu |
| 5,948,704 A | 9/1999 | Benjamin et al. |
| 5,997,687 A | 12/1999 | Koshimizu |
| 6,043,607 A | 3/2000 | Roderick |
| 6,051,114 A | 4/2000 | Yao et al. |
| 6,055,150 A | 4/2000 | Clinton et al. |
| 6,074,518 A | 6/2000 | Imafuku et al. |
| 6,089,181 A | 7/2000 | Suemasa et al. |
| 6,099,697 A | 8/2000 | Hausmann |
| 6,110,287 A | 8/2000 | Arai et al. |
| 6,117,279 A | 9/2000 | Smolanoff et al. |
| 6,125,025 A | 9/2000 | Howald et al. |
| 6,133,557 A | 10/2000 | Kawanabe et al. |
| 6,136,387 A | 10/2000 | Koizumi |
| 6,187,685 B1 | 2/2001 | Hopkins et al. |
| 6,197,151 B1 | 3/2001 | Kaji et al. |
| 6,198,616 B1 | 3/2001 | Dahimene et al. |
| 6,201,208 B1 | 3/2001 | Wendt et al. |
| 6,214,162 B1 | 4/2001 | Koshimizu |
| 6,232,236 B1 | 5/2001 | Shan et al. |
| 6,252,354 B1 | 6/2001 | Collins et al. |
| 6,253,704 B1 | 7/2001 | Savas |
| 6,277,506 B1 | 8/2001 | Okamoto |
| 6,309,978 B1 | 10/2001 | Donohoe et al. |
| 6,313,583 B1 | 11/2001 | Arita et al. |
| 6,355,992 B1 | 3/2002 | Via |
| 6,358,573 B1 | 3/2002 | Raoux et al. |
| 6,367,413 B1 | 4/2002 | Sill et al. |
| 6,392,187 B1 | 5/2002 | Johnson |
| 6,395,641 B2 | 5/2002 | Savas |
| 6,413,358 B2 | 7/2002 | Donohoe |
| 6,423,192 B1 | 7/2002 | Wada et al. |
| 6,433,297 B1 | 8/2002 | Kojima et al. |
| 6,435,131 B1 | 8/2002 | Koizumi |
| 6,451,389 B1 | 9/2002 | Amann et al. |
| 6,456,010 B2 | 9/2002 | Yamakoshi et al. |
| 6,483,731 B1 | 11/2002 | Isurin et al. |
| 6,535,785 B2 | 3/2003 | Johnson et al. |
| 6,621,674 B1 | 9/2003 | Zahringer et al. |
| 6,664,739 B1 | 12/2003 | Kishinevsky et al. |
| 6,733,624 B2 | 5/2004 | Koshiishi et al. |
| 6,740,842 B2 | 5/2004 | Johnson et al. |
| 6,741,446 B2 | 5/2004 | Ennis |
| 6,777,037 B2 | 8/2004 | Sumiya et al. |
| 6,808,607 B2 | 10/2004 | Christie |
| 6,818,103 B1 | 11/2004 | Scholl et al. |
| 6,818,257 B2 | 11/2004 | Amann et al. |
| 6,830,595 B2 | 12/2004 | Reynolds, III |
| 6,830,650 B2 | 12/2004 | Roche et al. |
| 6,849,154 B2 | 2/2005 | Nagahata et al. |
| 6,861,373 B2 | 3/2005 | Aoki et al. |
| 6,863,020 B2 | 3/2005 | Mitrovic et al. |
| 6,896,775 B2 | 5/2005 | Chistyakov |
| 6,902,646 B2 | 6/2005 | Mahoney et al. |
| 6,917,204 B2 | 7/2005 | Mitrovic et al. |
| 6,947,300 B2 | 9/2005 | Pai et al. |
| 6,962,664 B2 | 11/2005 | Mitrovic |
| 6,970,042 B2 | 11/2005 | Glueck |
| 6,972,524 B1 | 12/2005 | Marakhtanov et al. |
| 7,016,620 B2 | 3/2006 | Maess et al. |
| 7,046,088 B2 | 5/2006 | Ziegler |
| 7,059,267 B2 | 6/2006 | Hedberg et al. |
| 7,104,217 B2 | 9/2006 | Himori et al. |
| 7,115,185 B1 | 10/2006 | Gonzalez et al. |
| 7,126,808 B2 | 10/2006 | Koo et al. |
| 7,147,759 B2 | 12/2006 | Chistyakov |
| 7,151,242 B2 | 12/2006 | Schuler |
| 7,166,233 B2 | 1/2007 | Johnson et al. |
| 7,183,177 B2 | 2/2007 | Al-Bayati et al. |
| 7,206,189 B2 | 4/2007 | Reynolds, III |
| 7,218,503 B2 | 5/2007 | Howald |
| 7,218,872 B2 | 5/2007 | Shimomura |
| 7,226,868 B2 | 6/2007 | Mosden et al. |
| 7,265,963 B2 | 9/2007 | Hirose |
| 7,274,266 B2 | 9/2007 | Kirchmeier |
| 7,305,311 B2 | 12/2007 | van Zyl |
| 7,312,974 B2 | 12/2007 | Kuchimachi |
| 7,408,329 B2 | 8/2008 | Wiedemuth et al. |
| 7,415,940 B2 | 8/2008 | Koshimizu et al. |
| 7,440,301 B2 | 10/2008 | Kirchmeier et al. |
| 7,452,443 B2 | 11/2008 | Gluck et al. |
| 7,479,712 B2 | 1/2009 | Richert et al. |
| 7,509,105 B2 | 3/2009 | Ziegler |
| 7,512,387 B2 | 3/2009 | Glueck |
| 7,535,688 B2 | 5/2009 | Yokouchi et al. |
| 7,586,099 B2 | 9/2009 | Eyhorn et al. |
| 7,586,210 B2 | 9/2009 | Wiedemuth et al. |
| 7,588,667 B2 | 9/2009 | Cerio, Jr. |
| 7,601,246 B2 | 10/2009 | Kim et al. |
| 7,609,740 B2 | 10/2009 | Glueck |
| 7,618,686 B2 | 11/2009 | Colpo et al. |
| 7,633,319 B2 | 12/2009 | Arai |
| 7,645,341 B2 | 1/2010 | Kennedy et al. |
| 7,651,586 B2 | 1/2010 | Moriya et al. |
| 7,652,901 B2 | 1/2010 | Kirchmeier et al. |
| 7,692,936 B2 | 4/2010 | Richter |
| 7,700,474 B2 | 4/2010 | Cerio, Jr. |
| 7,705,676 B2 | 4/2010 | Kirchmeier et al. |
| 7,706,907 B2 | 4/2010 | Hiroki |
| 7,718,538 B2 | 5/2010 | Kim et al. |
| 7,740,704 B2 | 6/2010 | Strang |
| 7,758,764 B2 | 7/2010 | Dhindsa et al. |
| 7,761,247 B2 | 7/2010 | van Zyl |
| 7,782,100 B2 | 8/2010 | Steuber et al. |
| 7,791,912 B2 | 9/2010 | Walde |
| 7,795,817 B2 | 9/2010 | Nitschke |
| 7,808,184 B2 | 10/2010 | Chistyakov |
| 7,821,767 B2 | 10/2010 | Fujii |
| 7,825,719 B2 | 11/2010 | Roberg et al. |
| 7,858,533 B2 | 12/2010 | Liu et al. |
| 7,888,240 B2 | 2/2011 | Hamamjy et al. |
| 7,898,238 B2 | 3/2011 | Wiedemuth et al. |
| 7,929,261 B2 | 4/2011 | Wiedemuth |
| RE42,362 E | 5/2011 | Schuler |
| 7,977,256 B2 | 7/2011 | Liu et al. |
| 7,988,816 B2 | 8/2011 | Koshiishi et al. |
| 7,995,313 B2 | 8/2011 | Nitschke |
| 8,044,595 B2 | 10/2011 | Nitschke |
| 8,052,798 B2 | 11/2011 | Moriya et al. |
| 8,055,203 B2 | 11/2011 | Choueiry et al. |
| 8,083,961 B2 | 12/2011 | Chen et al. |
| 8,110,992 B2 | 2/2012 | Nitschke |
| 8,128,831 B2 | 3/2012 | Sato et al. |
| 8,129,653 B2 | 3/2012 | Kirchmeier et al. |
| 8,133,347 B2 | 3/2012 | Gluck et al. |
| 8,133,359 B2 | 3/2012 | Nauman et al. |
| 8,140,292 B2 | 3/2012 | Wendt |
| 8,217,299 B2 | 7/2012 | Ilic et al. |
| 8,221,582 B2 | 7/2012 | Patrick et al. |
| 8,236,109 B2 | 8/2012 | Moriya et al. |
| 8,284,580 B2 | 10/2012 | Wilson |

(56) References Cited

U.S. PATENT DOCUMENTS

| | | |
|---|---|---|
| 8,313,612 B2 | 11/2012 | McMillin et al. |
| 8,313,664 B2 | 11/2012 | Chen et al. |
| 8,333,114 B2 | 12/2012 | Hayashi |
| 8,361,906 B2 | 1/2013 | Lee et al. |
| 8,382,999 B2 | 2/2013 | Agarwal et al. |
| 8,383,001 B2 | 2/2013 | Mochiki et al. |
| 8,384,403 B2 | 2/2013 | Zollner et al. |
| 8,391,025 B2 | 3/2013 | Walde et al. |
| 8,399,366 B1 | 3/2013 | Takaba |
| 8,419,959 B2 | 4/2013 | Bettencourt et al. |
| 8,422,193 B2 | 4/2013 | Tao et al. |
| 8,441,772 B2 | 5/2013 | Yoshikawa et al. |
| 8,456,220 B2 | 6/2013 | Thome et al. |
| 8,460,567 B2 | 6/2013 | Chen |
| 8,466,622 B2 | 6/2013 | Knaus |
| 8,542,076 B2 | 9/2013 | Maier |
| 8,551,289 B2 | 10/2013 | Nishimura et al. |
| 8,568,606 B2 | 10/2013 | Ohse et al. |
| 8,603,293 B2 | 12/2013 | Koshiishi et al. |
| 8,632,537 B2 | 1/2014 | McNall, III et al. |
| 8,641,916 B2 | 2/2014 | Yatsuda et al. |
| 8,685,267 B2 | 4/2014 | Yatsuda et al. |
| 8,704,607 B2 | 4/2014 | Yuzurihara et al. |
| 8,716,114 B2 | 5/2014 | Ohmi et al. |
| 8,716,984 B2 | 5/2014 | Mueller et al. |
| 8,735,291 B2 | 5/2014 | Ranjan et al. |
| 8,796,933 B2 | 8/2014 | Hermanns |
| 8,809,199 B2 | 8/2014 | Nishizuka |
| 8,821,684 B2 | 9/2014 | Ui et al. |
| 8,828,883 B2 | 9/2014 | Rueger |
| 8,845,810 B2 | 9/2014 | Hwang |
| 8,852,347 B2 | 10/2014 | Lee et al. |
| 8,884,523 B2 | 11/2014 | Winterhalter et al. |
| 8,884,525 B2 | 11/2014 | Hoffman et al. |
| 8,889,534 B1 | 11/2014 | Ventzek et al. |
| 8,895,942 B2 | 11/2014 | Liu et al. |
| 8,907,259 B2 | 12/2014 | Kasai et al. |
| 8,916,056 B2 | 12/2014 | Koo et al. |
| 8,926,850 B2 | 1/2015 | Singh et al. |
| 8,963,377 B2 | 2/2015 | Ziemba et al. |
| 8,979,842 B2 | 3/2015 | McNall, III et al. |
| 8,993,943 B2 | 3/2015 | Pohl et al. |
| 9,011,636 B2 | 4/2015 | Ashida |
| 9,039,871 B2 | 5/2015 | Nauman et al. |
| 9,042,121 B2 | 5/2015 | Walde et al. |
| 9,053,908 B2 | 6/2015 | Sriraman et al. |
| 9,059,178 B2 | 6/2015 | Matsumoto et al. |
| 9,087,798 B2 | 7/2015 | Ohtake et al. |
| 9,101,038 B2 | 8/2015 | Singh et al. |
| 9,105,447 B2 | 8/2015 | Brouk et al. |
| 9,105,452 B2 | 8/2015 | Jeon et al. |
| 9,123,762 B2 | 9/2015 | Lin et al. |
| 9,129,776 B2 | 9/2015 | Finley et al. |
| 9,139,910 B2 | 9/2015 | Lee et al. |
| 9,147,555 B2 | 9/2015 | Richter |
| 9,150,960 B2 | 10/2015 | Nauman et al. |
| 9,159,575 B2 | 10/2015 | Ranjan et al. |
| 9,208,992 B2 | 12/2015 | Brouk et al. |
| 9,209,032 B2 | 12/2015 | Zhao et al. |
| 9,209,034 B2 | 12/2015 | Kitamura et al. |
| 9,210,790 B2 | 12/2015 | Hoffman et al. |
| 9,224,579 B2 | 12/2015 | Finley et al. |
| 9,226,380 B2 | 12/2015 | Finley |
| 9,228,878 B2 | 1/2016 | Haw et al. |
| 9,254,168 B2 | 2/2016 | Palanker |
| 9,263,241 B2 | 2/2016 | Larson et al. |
| 9,287,086 B2 | 3/2016 | Brouk et al. |
| 9,287,092 B2 | 3/2016 | Brouk et al. |
| 9,287,098 B2 | 3/2016 | Finley |
| 9,306,533 B1 | 4/2016 | Mavretic |
| 9,309,594 B2 | 4/2016 | Hoffman et al. |
| 9,313,872 B2 | 4/2016 | Yamazawa et al. |
| 9,355,822 B2 | 5/2016 | Yamada et al. |
| 9,362,089 B2 | 6/2016 | Brouk et al. |
| 9,373,521 B2 | 6/2016 | Mochiki et al. |
| 9,384,992 B2 | 7/2016 | Narishige et al. |
| 9,396,960 B2 | 7/2016 | Ogawa et al. |
| 9,404,176 B2 | 8/2016 | Parkhe et al. |
| 9,412,613 B2 | 8/2016 | Manna et al. |
| 9,435,029 B2 | 9/2016 | Brouk et al. |
| 9,483,066 B2 | 11/2016 | Finley |
| 9,490,107 B2 | 11/2016 | Kim et al. |
| 9,495,563 B2 | 11/2016 | Ziemba et al. |
| 9,496,150 B2 | 11/2016 | Mochiki et al. |
| 9,503,006 B2 | 11/2016 | Pohl et al. |
| 9,520,269 B2 | 12/2016 | Finley et al. |
| 9,530,667 B2 | 12/2016 | Rastogi et al. |
| 9,536,713 B2 | 1/2017 | Van Zyl et al. |
| 9,544,987 B2 | 1/2017 | Mueller et al. |
| 9,558,917 B2 | 1/2017 | Finley et al. |
| 9,564,287 B2 | 2/2017 | Ohse et al. |
| 9,570,313 B2 | 2/2017 | Ranjan et al. |
| 9,576,810 B2 | 2/2017 | Deshmukh et al. |
| 9,576,816 B2 | 2/2017 | Rastogi et al. |
| 9,577,516 B1 | 2/2017 | Van Zyl |
| 9,583,357 B1 | 2/2017 | Long et al. |
| 9,593,421 B2 | 3/2017 | Baek et al. |
| 9,601,283 B2 | 3/2017 | Ziemba et al. |
| 9,601,319 B1 | 3/2017 | Bravo et al. |
| 9,607,843 B2 | 3/2017 | Rastogi et al. |
| 9,620,340 B2 | 4/2017 | Finley |
| 9,620,376 B2 | 4/2017 | Kamp et al. |
| 9,620,987 B2 | 4/2017 | Alexander et al. |
| 9,637,814 B2 | 5/2017 | Bugyi et al. |
| 9,644,221 B2 | 5/2017 | Kanamori et al. |
| 9,651,957 B1 | 5/2017 | Finley |
| 9,655,221 B2 | 5/2017 | Ziemba et al. |
| 9,663,858 B2 | 5/2017 | Nagami et al. |
| 9,666,446 B2 | 5/2017 | Tominaga et al. |
| 9,666,447 B2 | 5/2017 | Rastogi et al. |
| 9,673,027 B2 | 6/2017 | Yamamoto et al. |
| 9,673,059 B2 | 6/2017 | Raley et al. |
| 9,685,297 B2 | 6/2017 | Carter et al. |
| 9,706,630 B2 | 7/2017 | Miller et al. |
| 9,711,331 B2 | 7/2017 | Mueller et al. |
| 9,711,335 B2 | 7/2017 | Christie |
| 9,728,429 B2 | 8/2017 | Ricci et al. |
| 9,734,992 B2 | 8/2017 | Yamada et al. |
| 9,741,544 B2 | 8/2017 | Van Zyl |
| 9,754,768 B2 | 9/2017 | Yamada et al. |
| 9,761,419 B2 | 9/2017 | Nagami |
| 9,761,459 B2 | 9/2017 | Long et al. |
| 9,767,988 B2 | 9/2017 | Brouk et al. |
| 9,786,503 B2 | 10/2017 | Raley et al. |
| 9,799,494 B2 | 10/2017 | Chen et al. |
| 9,805,916 B2 | 10/2017 | Konno et al. |
| 9,805,965 B2 | 10/2017 | Sadjadi et al. |
| 9,812,305 B2 | 11/2017 | Pelleymounter |
| 9,831,064 B2 | 11/2017 | Konno et al. |
| 9,837,285 B2 | 12/2017 | Tomura et al. |
| 9,840,770 B2 | 12/2017 | Klimczak et al. |
| 9,852,889 B1 | 12/2017 | Kellogg et al. |
| 9,852,890 B2 | 12/2017 | Mueller et al. |
| 9,865,471 B2 | 1/2018 | Shimoda et al. |
| 9,865,893 B2 | 1/2018 | Esswein et al. |
| 9,870,898 B2 | 1/2018 | Urakawa et al. |
| 9,872,373 B1 | 1/2018 | Shimizu et al. |
| 9,881,820 B2 | 1/2018 | Wong et al. |
| 9,922,802 B2 | 3/2018 | Hirano et al. |
| 9,922,806 B2 | 3/2018 | Tomura et al. |
| 9,929,004 B2 | 3/2018 | Ziemba et al. |
| 9,941,097 B2 | 4/2018 | Yamazawa et al. |
| 9,941,098 B2 | 4/2018 | Nagami |
| 9,960,763 B2 | 5/2018 | Miller et al. |
| 9,972,503 B2 | 5/2018 | Tomura et al. |
| 9,997,374 B2 | 6/2018 | Takeda et al. |
| 10,020,800 B2 | 7/2018 | Prager et al. |
| 10,026,593 B2 | 7/2018 | Alt et al. |
| 10,027,314 B2 | 7/2018 | Prager et al. |
| 10,041,174 B2 | 8/2018 | Matsumoto et al. |
| 10,042,407 B2 | 8/2018 | Grede et al. |
| 10,063,062 B2 | 8/2018 | Voronin et al. |
| 10,074,518 B2 | 9/2018 | Van Zyl |
| 10,085,796 B2 | 10/2018 | Podany |

(56) References Cited

U.S. PATENT DOCUMENTS

| | | |
|---|---|---|
| 10,090,191 B2 | 10/2018 | Tomura et al. |
| 10,102,321 B2 | 10/2018 | Povolny et al. |
| 10,109,461 B2 | 10/2018 | Yamada et al. |
| 10,115,567 B2 | 10/2018 | Hirano et al. |
| 10,115,568 B2 | 10/2018 | Kellogg et al. |
| 10,176,970 B2 | 1/2019 | Nitschke |
| 10,176,971 B2 | 1/2019 | Nagami |
| 10,181,392 B2 | 1/2019 | Leypold et al. |
| 10,199,246 B2 | 2/2019 | Koizumi et al. |
| 10,217,618 B2 | 2/2019 | Larson et al. |
| 10,217,933 B2 | 2/2019 | Nishimura et al. |
| 10,224,822 B2 | 3/2019 | Miller et al. |
| 10,229,819 B2 | 3/2019 | Hirano et al. |
| 10,249,498 B2 | 4/2019 | Ventzek et al. |
| 10,268,846 B2 | 4/2019 | Miller et al. |
| 10,269,540 B1 | 4/2019 | Carter et al. |
| 10,276,420 B2 | 4/2019 | Ito et al. |
| 10,282,567 B2 | 5/2019 | Miller et al. |
| 10,283,321 B2 | 5/2019 | Yang et al. |
| 10,290,506 B2 | 5/2019 | Ranjan et al. |
| 10,297,431 B2 | 5/2019 | Zelechowski et al. |
| 10,304,661 B2 | 5/2019 | Ziemba et al. |
| 10,304,668 B2 | 5/2019 | Coppa et al. |
| 10,312,048 B2 | 6/2019 | Dorf et al. |
| 10,312,056 B2 | 6/2019 | Collins et al. |
| 10,320,373 B2 | 6/2019 | Prager et al. |
| 10,332,730 B2 | 6/2019 | Christie |
| 10,340,123 B2 | 7/2019 | Ohtake |
| 10,348,186 B2 | 7/2019 | Schuler et al. |
| 10,354,839 B2 | 7/2019 | Alt et al. |
| 10,373,755 B2 | 8/2019 | Prager et al. |
| 10,373,804 B2 | 8/2019 | Koh et al. |
| 10,373,811 B2 | 8/2019 | Christie et al. |
| 10,381,237 B2 | 8/2019 | Takeda et al. |
| 10,382,022 B2 | 8/2019 | Prager et al. |
| 10,387,166 B2 | 8/2019 | Preston et al. |
| 10,388,544 B2 | 8/2019 | Ui et al. |
| 10,389,345 B2 | 8/2019 | Ziemba et al. |
| 10,410,877 B2 | 9/2019 | Takashima et al. |
| 10,431,437 B2 | 10/2019 | Gapinski et al. |
| 10,438,797 B2 | 10/2019 | Cottle et al. |
| 10,446,453 B2 | 10/2019 | Coppa et al. |
| 10,447,174 B1 | 10/2019 | Porter, Jr. et al. |
| 10,448,494 B1 | 10/2019 | Dorf et al. |
| 10,448,495 B1 | 10/2019 | Dorf et al. |
| 10,453,656 B2 | 10/2019 | Carducci et al. |
| 10,460,910 B2 | 10/2019 | Ziemba et al. |
| 10,460,911 B2 | 10/2019 | Ziemba et al. |
| 10,460,916 B2 | 10/2019 | Boyd, Jr. et al. |
| 10,483,089 B2 | 11/2019 | Ziemba et al. |
| 10,483,100 B2 | 11/2019 | Ishizaka et al. |
| 10,510,575 B2 | 12/2019 | Kraus et al. |
| 10,522,343 B2 | 12/2019 | Tapily et al. |
| 10,535,502 B2 | 1/2020 | Carducci et al. |
| 10,546,728 B2 | 1/2020 | Carducci et al. |
| 10,553,407 B2 | 2/2020 | Nagami et al. |
| 10,555,412 B2 | 2/2020 | Dorf et al. |
| 10,580,620 B2 | 3/2020 | Carducci et al. |
| 10,593,519 B2 | 3/2020 | Yamada et al. |
| 10,607,813 B2 | 3/2020 | Fairbairn et al. |
| 10,607,814 B2 | 3/2020 | Ziemba et al. |
| 10,658,189 B2 | 5/2020 | Hatazaki et al. |
| 10,659,019 B2 | 5/2020 | Slobodov et al. |
| 10,665,434 B2 | 5/2020 | Matsumoto et al. |
| 10,666,198 B2 | 5/2020 | Prager et al. |
| 10,672,589 B2 | 6/2020 | Koshimizu et al. |
| 10,672,596 B2 | 6/2020 | Brcka |
| 10,672,616 B2 | 6/2020 | Kubota |
| 10,685,807 B2 | 6/2020 | Dorf et al. |
| 10,707,053 B2 | 7/2020 | Urakawa et al. |
| 10,707,054 B1 | 7/2020 | Kubota |
| 10,707,055 B2 | 7/2020 | Shaw et al. |
| 10,707,086 B2 | 7/2020 | Yang et al. |
| 10,707,090 B2 | 7/2020 | Takayama et al. |
| 10,707,864 B2 | 7/2020 | Miller et al. |
| 10,714,372 B2 | 7/2020 | Chua et al. |
| 10,720,305 B2 | 7/2020 | Van Zyl |
| 10,734,906 B2 | 8/2020 | Miller et al. |
| 10,748,746 B2 | 8/2020 | Kaneko et al. |
| 10,755,894 B2 | 8/2020 | Hirano et al. |
| 10,763,150 B2 | 9/2020 | Lindley et al. |
| 10,770,267 B1 * | 9/2020 | Kartashyan ....... H01J 37/32183 |
| 10,773,282 B2 | 9/2020 | Coppa et al. |
| 10,774,423 B2 | 9/2020 | Janakiraman et al. |
| 10,777,388 B2 | 9/2020 | Ziemba et al. |
| 10,790,816 B2 | 9/2020 | Ziemba et al. |
| 10,791,617 B2 | 9/2020 | Dorf et al. |
| 10,796,887 B2 | 10/2020 | Prager et al. |
| 10,804,886 B2 | 10/2020 | Miller et al. |
| 10,811,227 B2 | 10/2020 | Van Zyl et al. |
| 10,811,228 B2 | 10/2020 | Van Zyl et al. |
| 10,811,229 B2 | 10/2020 | Van Zyl et al. |
| 10,811,230 B2 | 10/2020 | Ziemba et al. |
| 10,811,296 B2 | 10/2020 | Cho et al. |
| 10,847,346 B2 | 11/2020 | Ziemba et al. |
| 10,892,140 B2 | 1/2021 | Ziemba et al. |
| 10,892,141 B2 | 1/2021 | Ziemba et al. |
| 10,896,807 B2 | 1/2021 | Fairbairn et al. |
| 10,896,809 B2 | 1/2021 | Ziemba et al. |
| 10,903,047 B2 | 1/2021 | Ziemba et al. |
| 10,904,996 B2 | 1/2021 | Koh et al. |
| 10,916,408 B2 | 2/2021 | Dorf et al. |
| 10,923,320 B2 | 2/2021 | Koh et al. |
| 10,923,321 B2 | 2/2021 | Dorf et al. |
| 10,923,367 B2 | 2/2021 | Lubomirsky et al. |
| 10,923,379 B2 | 2/2021 | Liu et al. |
| 10,971,342 B2 | 4/2021 | Engelstaedter et al. |
| 10,978,274 B2 | 4/2021 | Kubota |
| 10,978,955 B2 | 4/2021 | Ziemba et al. |
| 10,985,740 B2 | 4/2021 | Prager et al. |
| 10,991,553 B2 | 4/2021 | Ziemba et al. |
| 10,991,554 B2 | 4/2021 | Zhao et al. |
| 10,998,169 B2 | 5/2021 | Ventzek et al. |
| 11,004,660 B2 | 5/2021 | Prager et al. |
| 11,011,349 B2 | 5/2021 | Brouk et al. |
| 11,075,058 B2 | 7/2021 | Ziemba et al. |
| 11,095,280 B2 | 8/2021 | Ziemba et al. |
| 11,101,108 B2 | 8/2021 | Slobodov et al. |
| 11,108,384 B2 | 8/2021 | Prager et al. |
| 2001/0003298 A1 | 6/2001 | Shamouilian et al. |
| 2001/0009139 A1 | 7/2001 | Shan et al. |
| 2001/0033755 A1 | 10/2001 | Ino et al. |
| 2002/0069971 A1 | 6/2002 | Kaji et al. |
| 2002/0078891 A1 | 6/2002 | Chu et al. |
| 2003/0026060 A1 | 2/2003 | Hiramatsu et al. |
| 2003/0029859 A1 | 2/2003 | Knoot et al. |
| 2003/0049558 A1 | 3/2003 | Aoki et al. |
| 2003/0052085 A1 | 3/2003 | Parsons |
| 2003/0079983 A1 | 5/2003 | Long et al. |
| 2003/0091355 A1 | 5/2003 | Jeschonek et al. |
| 2003/0137791 A1 | 7/2003 | Arnet et al. |
| 2003/0151372 A1 | 8/2003 | Tsuchiya et al. |
| 2003/0165044 A1 | 9/2003 | Yamamoto |
| 2003/0201069 A1 | 10/2003 | Johnson |
| 2004/0040665 A1 | 3/2004 | Mizuno et al. |
| 2004/0040931 A1 | 3/2004 | Koshiishi et al. |
| 2004/0066601 A1 | 4/2004 | Larsen |
| 2004/0112536 A1 | 6/2004 | Quon |
| 2004/0223284 A1 | 11/2004 | Iwami et al. |
| 2005/0022933 A1 | 2/2005 | Howard |
| 2005/0024809 A1 | 2/2005 | Kuchimachi |
| 2005/0039852 A1 | 2/2005 | Roche et al. |
| 2005/0092596 A1 | 5/2005 | Kouznetsov |
| 2005/0098118 A1 | 5/2005 | Amann et al. |
| 2005/0151544 A1 | 7/2005 | Mahoney et al. |
| 2005/0152159 A1 | 7/2005 | Isurin et al. |
| 2005/0286916 A1 | 12/2005 | Nakazato et al. |
| 2006/0075969 A1 | 4/2006 | Fischer |
| 2006/0077020 A1 * | 4/2006 | Wang ................. H01P 1/20381<br>333/204 |
| 2006/0130767 A1 | 6/2006 | Herchen |
| 2006/0139843 A1 | 6/2006 | Kim |
| 2006/0158823 A1 | 7/2006 | Mizuno et al. |
| 2006/0171848 A1 | 8/2006 | Roche et al. |

(56) References Cited

U.S. PATENT DOCUMENTS

| | | |
|---|---|---|
| 2006/0219178 A1 | 10/2006 | Asakura |
| 2006/0278521 A1 | 12/2006 | Stowell |
| 2007/0113787 A1 | 5/2007 | Higashiura et al. |
| 2007/0114981 A1 | 5/2007 | Vasquez et al. |
| 2007/0196977 A1 | 8/2007 | Wang et al. |
| 2007/0284344 A1 | 12/2007 | Todorov et al. |
| 2007/0285869 A1 | 12/2007 | Howald |
| 2007/0297118 A1 | 12/2007 | Fujii |
| 2008/0012548 A1 | 1/2008 | Gerhardt et al. |
| 2008/0037196 A1 | 2/2008 | Yonekura et al. |
| 2008/0048498 A1 | 2/2008 | Wiedemuth et al. |
| 2008/0106842 A1 | 5/2008 | Ito et al. |
| 2008/0135401 A1 | 6/2008 | Kadlec et al. |
| 2008/0160212 A1 | 7/2008 | Koo et al. |
| 2008/0185537 A1 | 8/2008 | Walther et al. |
| 2008/0210545 A1 | 9/2008 | Kouznetsov |
| 2008/0236493 A1 | 10/2008 | Sakao |
| 2008/0252225 A1 | 10/2008 | Kurachi et al. |
| 2008/0272706 A1 | 11/2008 | Kwon et al. |
| 2008/0289576 A1 | 11/2008 | Lee et al. |
| 2009/0016549 A1 | 1/2009 | French et al. |
| 2009/0059462 A1 | 3/2009 | Mizuno et al. |
| 2009/0078678 A1 | 3/2009 | Kojima et al. |
| 2009/0133839 A1 | 5/2009 | Yamazawa et al. |
| 2009/0165955 A1* | 7/2009 | Sumiya ............... C23C 16/5096 156/345.48 |
| 2009/0236214 A1 | 9/2009 | Janakiraman et al. |
| 2009/0295295 A1 | 12/2009 | Shannon et al. |
| 2010/0018648 A1 | 1/2010 | Collins et al. |
| 2010/0025230 A1 | 2/2010 | Ehiasarian et al. |
| 2010/0029038 A1 | 2/2010 | Murakawa |
| 2010/0072172 A1 | 3/2010 | Ui et al. |
| 2010/0101935 A1 | 4/2010 | Chistyakov et al. |
| 2010/0118464 A1 | 5/2010 | Matsuyama |
| 2010/0154994 A1 | 6/2010 | Fischer et al. |
| 2010/0193491 A1 | 8/2010 | Cho et al. |
| 2010/0271744 A1 | 10/2010 | Ni et al. |
| 2010/0276273 A1 | 11/2010 | Heckman et al. |
| 2010/0321047 A1 | 12/2010 | Zollner et al. |
| 2010/0326957 A1 | 12/2010 | Maeda et al. |
| 2011/0096461 A1 | 4/2011 | Yoshikawa et al. |
| 2011/0100807 A1 | 5/2011 | Matsubara et al. |
| 2011/0143537 A1 | 6/2011 | Lee et al. |
| 2011/0157760 A1 | 6/2011 | Willwerth et al. |
| 2011/0177669 A1 | 7/2011 | Lee et al. |
| 2011/0177694 A1 | 7/2011 | Chen et al. |
| 2011/0259851 A1 | 10/2011 | Brouk et al. |
| 2011/0281438 A1 | 11/2011 | Lee et al. |
| 2011/0298376 A1 | 12/2011 | Kanegae et al. |
| 2012/0000421 A1 | 1/2012 | Miller et al. |
| 2012/0052599 A1 | 3/2012 | Brouk et al. |
| 2012/0081350 A1 | 4/2012 | Sano et al. |
| 2012/0088371 A1 | 4/2012 | Ranjan et al. |
| 2012/0097908 A1 | 4/2012 | Willwerth et al. |
| 2012/0171390 A1 | 7/2012 | Nauman et al. |
| 2012/0319584 A1 | 12/2012 | Brouk et al. |
| 2013/0059448 A1 | 3/2013 | Marakhtanov et al. |
| 2013/0087447 A1 | 4/2013 | Bodke et al. |
| 2013/0175575 A1 | 7/2013 | Ziemba et al. |
| 2013/0213935 A1 | 8/2013 | Liao et al. |
| 2013/0214828 A1 | 8/2013 | Valcore, Jr. et al. |
| 2013/0220549 A1 | 8/2013 | Wilson |
| 2013/0340938 A1 | 12/2013 | Tappan et al. |
| 2013/0344702 A1 | 12/2013 | Nishizuka |
| 2014/0057447 A1 | 2/2014 | Yang et al. |
| 2014/0061156 A1 | 3/2014 | Brouk et al. |
| 2014/0062495 A1 | 3/2014 | Carter et al. |
| 2014/0077611 A1 | 3/2014 | Young et al. |
| 2014/0109886 A1 | 4/2014 | Singleton et al. |
| 2014/0117861 A1 | 5/2014 | Finley et al. |
| 2014/0125315 A1 | 5/2014 | Kirchmeier et al. |
| 2014/0154819 A1 | 6/2014 | Gaff et al. |
| 2014/0177123 A1 | 6/2014 | Thach et al. |
| 2014/0238844 A1 | 8/2014 | Chistyakov |
| 2014/0262755 A1 | 9/2014 | Deshmukh et al. |
| 2014/0263182 A1 | 9/2014 | Chen et al. |
| 2014/0273487 A1 | 9/2014 | Deshmukh et al. |
| 2014/0305905 A1 | 10/2014 | Yamada et al. |
| 2014/0356984 A1 | 12/2014 | Ventzek et al. |
| 2014/0361690 A1 | 12/2014 | Yamada et al. |
| 2015/0002018 A1 | 1/2015 | Lill et al. |
| 2015/0043123 A1 | 2/2015 | Cox |
| 2015/0076112 A1 | 3/2015 | Sriraman et al. |
| 2015/0084509 A1 | 3/2015 | Yuzurihara et al. |
| 2015/0111394 A1 | 4/2015 | Hsu et al. |
| 2015/0116889 A1 | 4/2015 | Yamasaki et al. |
| 2015/0130354 A1 | 5/2015 | Leray et al. |
| 2015/0130525 A1 | 5/2015 | Miller et al. |
| 2015/0170952 A1 | 6/2015 | Subramani et al. |
| 2015/0181683 A1 | 6/2015 | Singh et al. |
| 2015/0235809 A1 | 8/2015 | Ito et al. |
| 2015/0256086 A1 | 9/2015 | Miller et al. |
| 2015/0270105 A1* | 9/2015 | Kobayashi .......... H01J 37/3299 315/34 |
| 2015/0303914 A1 | 10/2015 | Ziemba et al. |
| 2015/0315698 A1 | 11/2015 | Chistyakov |
| 2015/0318846 A1 | 11/2015 | Prager et al. |
| 2015/0325413 A1 | 11/2015 | Kim et al. |
| 2015/0366004 A1 | 12/2015 | Nangoy et al. |
| 2016/0004475 A1 | 1/2016 | Beniyama et al. |
| 2016/0020072 A1 | 1/2016 | Brouk et al. |
| 2016/0027678 A1 | 1/2016 | Parkhe et al. |
| 2016/0056017 A1 | 2/2016 | Kim et al. |
| 2016/0064189 A1 | 3/2016 | Tandou et al. |
| 2016/0064194 A1* | 3/2016 | Tokashiki .......... H01J 37/32577 156/345.28 |
| 2016/0196958 A1 | 7/2016 | Leray et al. |
| 2016/0241234 A1 | 8/2016 | Mavretic |
| 2016/0284514 A1 | 9/2016 | Hirano et al. |
| 2016/0314946 A1 | 10/2016 | Pelleymounter |
| 2016/0322242 A1 | 11/2016 | Nguyen et al. |
| 2016/0327029 A1 | 11/2016 | Ziemba et al. |
| 2016/0351375 A1 | 12/2016 | Valcore, Jr. et al. |
| 2016/0358755 A1 | 12/2016 | Long et al. |
| 2017/0011887 A1 | 1/2017 | Deshmukh et al. |
| 2017/0018411 A1 | 1/2017 | Sriraman et al. |
| 2017/0022604 A1 | 1/2017 | Christie et al. |
| 2017/0029937 A1 | 2/2017 | Chistyakov et al. |
| 2017/0069462 A1 | 3/2017 | Kanarik et al. |
| 2017/0076962 A1 | 3/2017 | Engelhardt |
| 2017/0098527 A1 | 4/2017 | Kawasaki et al. |
| 2017/0098549 A1 | 4/2017 | Agarwal |
| 2017/0110335 A1 | 4/2017 | Yang et al. |
| 2017/0110358 A1 | 4/2017 | Sadjadi et al. |
| 2017/0113355 A1 | 4/2017 | Genetti et al. |
| 2017/0115657 A1 | 4/2017 | Trussell et al. |
| 2017/0117172 A1 | 4/2017 | Genetti et al. |
| 2017/0154726 A1 | 6/2017 | Prager et al. |
| 2017/0162417 A1 | 6/2017 | Ye et al. |
| 2017/0163254 A1 | 6/2017 | Ziemba et al. |
| 2017/0169996 A1 | 6/2017 | Ui et al. |
| 2017/0170449 A1 | 6/2017 | Alexander et al. |
| 2017/0178917 A1 | 6/2017 | Kamp et al. |
| 2017/0221682 A1 | 8/2017 | Nishimura et al. |
| 2017/0236688 A1 | 8/2017 | Caron et al. |
| 2017/0236741 A1 | 8/2017 | Angelov et al. |
| 2017/0236743 A1 | 8/2017 | Severson et al. |
| 2017/0243731 A1 | 8/2017 | Ziemba et al. |
| 2017/0250056 A1 | 8/2017 | Boswell et al. |
| 2017/0263478 A1 | 9/2017 | McCHESNEY et al. |
| 2017/0278665 A1 | 9/2017 | Carter et al. |
| 2017/0287791 A1 | 10/2017 | Coppa et al. |
| 2017/0311431 A1 | 10/2017 | Park |
| 2017/0316935 A1 | 11/2017 | Tan et al. |
| 2017/0330734 A1 | 11/2017 | Lee et al. |
| 2017/0330786 A1 | 11/2017 | Genetti et al. |
| 2017/0334074 A1 | 11/2017 | Genetti et al. |
| 2017/0358431 A1 | 12/2017 | Dorf et al. |
| 2017/0366173 A1 | 12/2017 | Miller et al. |
| 2017/0372912 A1 | 12/2017 | Long et al. |
| 2018/0019100 A1 | 1/2018 | Brouk et al. |
| 2018/0076032 A1 | 3/2018 | Wang et al. |
| 2018/0102769 A1 | 4/2018 | Prager et al. |
| 2018/0139834 A1 | 5/2018 | Nagashima et al. |

(56) References Cited

U.S. PATENT DOCUMENTS

| | | |
|---|---|---|
| 2018/0166249 A1 | 6/2018 | Dorf et al. |
| 2018/0189524 A1 | 7/2018 | Miller et al. |
| 2018/0190501 A1 | 7/2018 | Ueda |
| 2018/0204708 A1 | 7/2018 | Tan et al. |
| 2018/0205369 A1 | 7/2018 | Prager et al. |
| 2018/0218905 A1 | 8/2018 | Park et al. |
| 2018/0226225 A1 | 8/2018 | Koh et al. |
| 2018/0226896 A1 | 8/2018 | Miller et al. |
| 2018/0253570 A1 | 9/2018 | Miller et al. |
| 2018/0286636 A1 | 10/2018 | Ziemba et al. |
| 2018/0294566 A1 | 10/2018 | Wang et al. |
| 2018/0309423 A1 | 10/2018 | Okunishi et al. |
| 2018/0331655 A1 | 11/2018 | Prager et al. |
| 2018/0350649 A1 | 12/2018 | Gomm |
| 2018/0366305 A1 | 12/2018 | Nagami et al. |
| 2018/0374672 A1 | 12/2018 | Hayashi et al. |
| 2019/0027344 A1 | 1/2019 | Okunishi et al. |
| 2019/0080884 A1 | 3/2019 | Ziemba et al. |
| 2019/0090338 A1 | 3/2019 | Koh et al. |
| 2019/0096633 A1 | 3/2019 | Pankratz et al. |
| 2019/0157041 A1 | 5/2019 | Zyl et al. |
| 2019/0157042 A1 | 5/2019 | Van Zyl et al. |
| 2019/0157044 A1 | 5/2019 | Ziemba et al. |
| 2019/0172685 A1 | 6/2019 | Van Zyl et al. |
| 2019/0172688 A1 | 6/2019 | Ueda |
| 2019/0180982 A1 | 6/2019 | Brouk et al. |
| 2019/0198333 A1 | 6/2019 | Tokashiki |
| 2019/0259562 A1 | 8/2019 | Dorf et al. |
| 2019/0267218 A1 | 8/2019 | Wang et al. |
| 2019/0277804 A1 | 9/2019 | Prager et al. |
| 2019/0295769 A1 | 9/2019 | Prager et al. |
| 2019/0295819 A1 | 9/2019 | Okunishi et al. |
| 2019/0318918 A1 | 10/2019 | Saitoh et al. |
| 2019/0333741 A1 | 10/2019 | Nagami et al. |
| 2019/0341232 A1 | 11/2019 | Thokachichu et al. |
| 2019/0348258 A1 | 11/2019 | Koh et al. |
| 2019/0348263 A1 | 11/2019 | Okunishi |
| 2019/0363388 A1 | 11/2019 | Esswein et al. |
| 2019/0385822 A1 | 12/2019 | Marakhtanov et al. |
| 2019/0393791 A1 | 12/2019 | Ziemba et al. |
| 2020/0016109 A1 | 1/2020 | Feng et al. |
| 2020/0020510 A1 | 1/2020 | Shoeb et al. |
| 2020/0024330 A1 | 1/2020 | Chan-Hui et al. |
| 2020/0035457 A1 | 1/2020 | Ziemba et al. |
| 2020/0035458 A1 | 1/2020 | Ziemba et al. |
| 2020/0035459 A1 | 1/2020 | Ziemba et al. |
| 2020/0036367 A1 | 1/2020 | Slobodov et al. |
| 2020/0037468 A1 | 1/2020 | Ziemba et al. |
| 2020/0051785 A1 | 2/2020 | Miller et al. |
| 2020/0051786 A1 | 2/2020 | Ziemba et al. |
| 2020/0058475 A1 | 2/2020 | Engelstaedter et al. |
| 2020/0066497 A1 | 2/2020 | Engelstaedter et al. |
| 2020/0066498 A1 | 2/2020 | Engelstaedter et al. |
| 2020/0075293 A1 | 3/2020 | Ventzek et al. |
| 2020/0090905 A1 | 3/2020 | Brouk et al. |
| 2020/0106137 A1 | 4/2020 | Murphy et al. |
| 2020/0126760 A1 | 4/2020 | Ziemba et al. |
| 2020/0126837 A1 | 4/2020 | Kuno et al. |
| 2020/0144030 A1 | 5/2020 | Prager et al. |
| 2020/0161091 A1 | 5/2020 | Ziemba et al. |
| 2020/0161098 A1 | 5/2020 | Cui et al. |
| 2020/0161155 A1 | 5/2020 | Rogers et al. |
| 2020/0162061 A1 | 5/2020 | Prager et al. |
| 2020/0168436 A1 | 5/2020 | Ziemba et al. |
| 2020/0168437 A1 | 5/2020 | Ziemba et al. |
| 2020/0176221 A1 | 6/2020 | Prager et al. |
| 2020/0227230 A1 | 7/2020 | Ziemba et al. |
| 2020/0227289 A1 | 7/2020 | Song et al. |
| 2020/0234922 A1 | 7/2020 | Dorf et al. |
| 2020/0234923 A1 | 7/2020 | Dorf et al. |
| 2020/0243303 A1 | 7/2020 | Mishra et al. |
| 2020/0251371 A1 | 8/2020 | Kuno et al. |
| 2020/0266022 A1 | 8/2020 | Dorf et al. |
| 2020/0266035 A1 | 8/2020 | Nagaiwa |
| 2020/0294770 A1 | 9/2020 | Kubota |
| 2020/0328739 A1 | 10/2020 | Miller et al. |
| 2020/0352017 A1 | 11/2020 | Dorf et al. |
| 2020/0357607 A1 | 11/2020 | Ziemba et al. |
| 2020/0373114 A1 | 11/2020 | Prager et al. |
| 2020/0389126 A1 | 12/2020 | Prager et al. |
| 2020/0407840 A1 | 12/2020 | Hayashi et al. |
| 2020/0411286 A1 | 12/2020 | Koshimizu et al. |
| 2021/0005428 A1 | 1/2021 | Shaw et al. |
| 2021/0013006 A1 | 1/2021 | Nguyen et al. |
| 2021/0013011 A1 | 1/2021 | Prager et al. |
| 2021/0013874 A1 | 1/2021 | Miller et al. |
| 2021/0027990 A1 | 1/2021 | Ziemba et al. |
| 2021/0029815 A1 | 1/2021 | Bowman et al. |
| 2021/0043472 A1 | 2/2021 | Koshimizu et al. |
| 2021/0051792 A1 | 2/2021 | Dokan et al. |
| 2021/0066042 A1 | 3/2021 | Ziemba et al. |
| 2021/0082669 A1 | 3/2021 | Koshiishi et al. |
| 2021/0091759 A1 | 3/2021 | Prager et al. |
| 2021/0125812 A1 | 4/2021 | Ziemba et al. |
| 2021/0130955 A1 | 5/2021 | Nagaike et al. |
| 2021/0140044 A1 | 5/2021 | Nagaike et al. |
| 2021/0151295 A1 | 5/2021 | Ziemba et al. |
| 2021/0152163 A1 | 5/2021 | Miller et al. |
| 2021/0210313 A1 | 7/2021 | Ziemba et al. |
| 2021/0210315 A1 | 7/2021 | Ziemba et al. |
| 2021/0249227 A1 | 8/2021 | Bowman et al. |
| 2021/0272775 A1 | 9/2021 | Koshimizu |
| 2021/0288582 A1 | 9/2021 | Ziemba et al. |

FOREIGN PATENT DOCUMENTS

| | | | |
|---|---|---|---|
| CN | 101707186 B | 2/2012 | |
| CN | 105408993 A | 3/2016 | |
| CN | 106206234 A | 12/2016 | |
| CN | 104752134 B | 2/2017 | |
| CN | 112563700 A * | 3/2021 | .......... H01P 1/20381 |
| EP | 665306 A1 | 8/1995 | |
| EP | 983394 A1 | 3/2000 | |
| EP | 1119033 A1 | 7/2001 | |
| EP | 1203441 A1 | 5/2002 | |
| EP | 1214459 A1 | 6/2002 | |
| EP | 1418670 A1 | 5/2004 | |
| EP | 1691481 A1 | 8/2006 | |
| EP | 1701376 A1 | 9/2006 | |
| EP | 1708239 A1 | 10/2006 | |
| EP | 1780777 A1 | 5/2007 | |
| EP | 1852959 A1 | 11/2007 | |
| EP | 2016610 A1 | 1/2009 | |
| EP | 2096679 A1 | 9/2009 | |
| EP | 2221614 A1 | 8/2010 | |
| EP | 2541584 A1 | 1/2013 | |
| EP | 2580368 A1 | 4/2013 | |
| EP | 2612544 A1 | 7/2013 | |
| EP | 2838112 A1 | 2/2015 | |
| EP | 2991103 A1 | 3/2016 | |
| EP | 3086359 A1 | 10/2016 | |
| EP | 3396700 A1 | 10/2018 | |
| EP | 3616234 A1 | 3/2020 | |
| JP | H08236602 A | 9/1996 | |
| JP | 2748213 B2 | 5/1998 | |
| JP | H11025894 A | 1/1999 | |
| JP | 2002299322 A | 10/2002 | |
| JP | 2002313899 A | 10/2002 | |
| JP | 4418424 B2 | 2/2010 | |
| JP | 2011035266 A | 2/2011 | |
| JP | 5018244 B2 | 9/2012 | |
| JP | 2014112644 A | 6/2014 | |
| JP | 2016225439 A | 12/2016 | |
| JP | 6741461 B2 | 8/2020 | |
| KR | 100757347 B1 | 9/2007 | |
| KR | 10-2007-0098556 A | 10/2007 | |
| KR | 20160042429 A | 4/2016 | |
| KR | 1020170121500 A | 11/2017 | |
| KR | 20200036947 A | 4/2020 | |
| TW | 498706 B | 8/2002 | |
| TW | 201717247 A | 5/2017 | |
| WO | 1998053116 A1 | 11/1998 | |
| WO | 2000017920 A1 | 3/2000 | |
| WO | 2000030147 A1 | 5/2000 | |

(56) References Cited

FOREIGN PATENT DOCUMENTS

| | | |
|---|---|---|
| WO | 2000063459 A1 | 10/2000 |
| WO | 2001005020 A1 | 1/2001 |
| WO | 2001012873 A1 | 2/2001 |
| WO | 2001013402 A1 | 2/2001 |
| WO | 2002052628 A1 | 7/2002 |
| WO | 2002054835 A2 | 7/2002 |
| WO | 2002059954 A1 | 8/2002 |
| WO | 2003037497 A2 | 5/2003 |
| WO | 2003052882 A2 | 6/2003 |
| WO | 2003054911 A2 | 7/2003 |
| WO | 2003077414 A2 | 9/2003 |
| WO | 2004084394 A1 | 9/2004 |
| WO | 2005124844 A1 | 12/2005 |
| WO | 2007118042 A2 | 10/2007 |
| WO | 2008016747 A2 | 2/2008 |
| WO | 2008050619 A1 | 5/2008 |
| WO | 2008061775 A1 | 5/2008 |
| WO | 2008061784 A1 | 5/2008 |
| WO | 2008062663 A1 | 5/2008 |
| WO | 2009012804 A1 | 1/2009 |
| WO | 2009069670 A1 | 6/2009 |
| WO | 2009111473 A2 | 9/2009 |
| WO | 2011073093 A1 | 6/2011 |
| WO | 2011087984 A2 | 7/2011 |
| WO | 2011156055 A1 | 12/2011 |
| WO | 2012030500 A1 | 3/2012 |
| WO | 2012109159 A1 | 8/2012 |
| WO | 2012122064 A1 | 9/2012 |
| WO | 2013000918 A1 | 1/2013 |
| WO | 2013016619 A1 | 1/2013 |
| WO | 2013084459 A1 | 6/2013 |
| WO | 2013088677 A1 | 6/2013 |
| WO | 2013099133 A1 | 7/2013 |
| WO | 2013114882 A1 | 8/2013 |
| WO | 2013118660 A1 | 8/2013 |
| WO | 2013125523 A1 | 8/2013 |
| WO | 2013187218 A1 | 12/2013 |
| WO | 2014035889 A1 | 3/2014 |
| WO | 2014035894 A1 | 3/2014 |
| WO | 2014035897 A1 | 3/2014 |
| WO | 2014036000 A1 | 3/2014 |
| WO | 2014124857 A2 | 8/2014 |
| WO | 2014197145 A1 | 12/2014 |
| WO | 2017208807 A1 | 12/2014 |
| WO | 2015060185 A1 | 4/2015 |
| WO | 2014124857 A3 | 5/2015 |
| WO | 2015134398 A1 | 9/2015 |
| WO | 2015198854 A1 | 12/2015 |
| WO | 2016002547 A1 | 1/2016 |
| WO | 2016060058 A1 | 4/2016 |
| WO | 2016060063 A1 | 4/2016 |
| WO | 2015073921 A8 | 5/2016 |
| WO | 2016104098 A1 | 6/2016 |
| WO | 2016128384 A1 | 8/2016 |
| WO | 2016131061 A1 | 8/2016 |
| WO | 2016170989 A1 | 10/2016 |
| WO | 2017172536 A1 | 10/2017 |
| WO | 2018048925 A1 | 3/2018 |
| WO | 2018111751 A1 | 6/2018 |
| WO | 2018170010 A1 | 9/2018 |
| WO | 2018197702 A1 | 11/2018 |
| WO | 2018200409 A1 | 11/2018 |
| WO | 2019036587 A1 | 2/2019 |
| WO | 2019040949 A1 | 2/2019 |
| WO | 2019099870 A1 | 5/2019 |
| WO | 2019185423 A1 | 10/2019 |
| WO | 2019225184 A1 | 11/2019 |
| WO | 2019239872 A1 | 12/2019 |
| WO | 2019244697 A1 | 12/2019 |
| WO | 2019244698 A1 | 12/2019 |
| WO | 2019244734 A1 | 12/2019 |
| WO | 2019245729 A1 | 12/2019 |
| WO | 2020004048 A1 | 1/2020 |
| WO | 2020017328 A1 | 1/2020 |
| WO | 2020022318 A1 | 1/2020 |
| WO | 2020022319 A1 | 1/2020 |
| WO | 2020026802 A1 | 2/2020 |
| WO | 2020036806 A1 | 2/2020 |
| WO | 2020037331 A1 | 2/2020 |
| WO | 2020046561 A1 | 3/2020 |
| WO | 2020051064 A1 | 3/2020 |
| WO | 2020112921 A1 | 6/2020 |
| WO | 2020121819 A1 | 6/2020 |
| WO | 2020145051 A1 | 7/2020 |
| WO | 2021003319 A1 | 1/2021 |
| WO | 2016059207 A1 | 4/2021 |
| WO | 2021062223 A1 | 4/2021 |
| WO | 2021097459 A1 | 5/2021 |
| WO | 2021134000 A1 | 7/2021 |
| WO | 2019099102 A1 | 5/2024 |

OTHER PUBLICATIONS

Wang, S.B., et al.—"Control of ion energy distribution at substrates during plasma processing," Journal of Applied Physics, vol. 88, No. 2, Jul. 15, 2000, pp. 643-646.

PCT International Search Report and Written Opinion dated Nov. 9, 2018, for International Application No. PCT/ US2018/043032.

Taiwan Office Action for Application No. 107125613 dated Dec. 24, 2020, 16 pages.

PCT International Search Report and Written Opinion dated Nov. 7, 2018, for International Application No_ PCT/US2018/042965.

Eagle Harbor Technologies presentation by Dr. Kenneth E. Miller— "The EHT Integrated Power Module (IPM): An IGBT-Based, High Current, Ultra-Fast, Modular, Programmable Power Supply Unit," Jun. 2013, 21 pages.

Eagle Harbor Technologies webpage—"EHT Integrator Demonstration at DIII-D," 2015, 1 page.

Eagle Harbor Technologies webpage—"High Gain and Frequency Ultra-Stable Integrators for ICC and Long Pulse ITER Applications," 2012, 1 page.

Eagle Harbor Technologies webpage—High Gain and Frequency Ultra-Stable Integrators for Long Pulse and/or High Current Applications, 2018, 1 page.

Eagle Harbor Technologies webpage—"In Situ Testing of EHT Integrators on a Tokamak," 2015, 1 page.

Eagle Harbor Technologies webpage—"Long-Pulse Integrator Testing with DIII-D Magnetic Diagnostics," 2016, 1 page.

Kamada, Keiichi, et al., Editors—"New Developments of Plasma Science with Pulsed Power Technology," Research Report, NIFS-PROC-82, presented at National Institute for Fusion Science, Toki, Gifu, Japan, Mar. 5-6, 2009, 109 pages.

Prager, J.R., et al.—"A High Voltage Nanosecond Pulser with Variable Pulse Width and Pulse Repetition Frequency Control for Nonequilibrium Plasma Applications," IEEE 41st International Conference on Plasma Sciences {ICOPS) held with 2014 IEEE International Conference on High-Power Particle Beams (BEAMS), pp_ 1-6, 2014.

Semiconductor Components Industries, LLC (SCILLC) - "Switch-Mode Power Supply" Reference Manual, SMPSRM/D, Rev. 4, Apr. 2014, ON Semiconductor, 73 pages.

Sunstone Circuits—"Eagle Harbor Tech Case Study," date unknown, 4 pages.

International Search Report and Written Opinion for PCT/US2019/052067 dated Jan. 21, 2020.

ELECTRICAL 4 U webpage—"Clamping Circuit," Aug. 29, 2018, 9 pages.

Kyung Chae Yang et al., A study on the etching characteristics of magnetic tunneling junction materials using DC pulse-biased inductively coupled plasmas, Japanese Journal of Applied Physics, vol. 54, 01AE01, Oct. 29, 2014, 6 pages.

PCT Notification of Transmittal of the International Search Report and the Written Opinion of the International Searching Authority for International Application No. PCT/US2019/048392; dated Dec. 16, 2019; 13 pages.

PCT International Search Report and Written Opinion dated Nov. 7, 2018, for International Application No. PCT/US2018/042961.

(56) References Cited

OTHER PUBLICATIONS

PCT International Search Report and Written Opinion dated Nov. 7, 2018, for International Application No. PCT/US2018/042956.
U.S. Appl. No. 62/433,204; entitled Creating Arbitrarily-Shaped Ion Energy Distribution Function {IEDF} Using Shaped- Pulse (EV) Bias; by Leonid Dorf, et al.; filed Dec. 16, 2016; 22 total pages.
U.S. Appl. No. 15/424,405; entitled System for Tunable Workpiece Biasing in a Plasma Reactor; by Travis Koh, et al.; filed Feb. 3, 2017; 29 total pages.
U.S. Appl. No. 15/618,082; entitled Systems and Methods for Controlling a Voltage Waveform at a Substrate During Plasma Processing; by Leonid Dorf, et al.; filed Jun. 8, 2017; 35 total pages.
PCT Notification of Transmittal of the International Search Report and the Written Opinion of the International Searching Authority for International Application No. PCT/US2018/046171; dated Nov. 28, 2018; 10 total pages.
PCT Notification of Transmittal of the International Search Report and the Written Opinion of the International Searching Authority for International Application No. PCT/US2018/046182; dated Nov. 30, 2018; 10 total pages.
Eagle Harbor Technologies presentation by Dr. Kenneth E. Miller- "The EHT Long Pulse Integrator Program," ITPA Diagnostic Meeting, General Atomics, Jun. 4-7, 2013, 18 pages.
Lin, Jianliang, et al., —"Diamond like carbon films deposited by HiPIMS using oscillatory voltage pulses," Surface & Coatings Technology 258, 2014, published by Elsevier B.V., pp. 1212-1222.
PCT/US2020/014453 Interanational Search Report and Written Opinion dated May 14, 2020 consists of 8 pages.
S.B. Wang et al. "Ion Bombardment Energy and SiO 2/Si Fluorocarbon Plasma Etch Selectivity", Journal of Vacuum Science & Technology A 19, 2425 (2001).
Korean Office Action for 10-2020-7007495 dated Jun. 14, 2021.
Zhen-hua Bi et al., A brief review of dual-frequency capacitively coupled discharges, Current Applied Physics, vol. 11, Issue 5, Supplement, 2011, pp. S2-S8.
Chang, Bingdong, " Oblique angled plasma etching for 3D silicon structures with wiggling geometries" 31(8), [085301]. https://doi.org/10.1088/1361-6528/ab53fb. DTU Library. 2019.

Michael A. Lieberman, "A short course of the principles of plasma discharges and materials processing", Department of Electrical Engineering and Computer Sciences University of California, Berkeley, CA 94720.
Dr. Steve Sirard, "Introduction to Plasma Etching", Lam Research Corporation. 64 pages.
Zhuoxing Luo, B_S_, M.S, "Rf Plasma Etching With A Dc Bias" A Dissertation in Physics_ Dec. 1994.
Michael A. Lieberman, "Principles of Plasma Discharges and Material Processing", A Wiley Interscience Publication. 1994.
Yiting Zhang et al. "Investigation of feature orientation and consequences of ion tilting during plasma etching with a three-dimensional feature profile simulator", Nov. 22, 2016.
Richard Barnett et al. A New Plasma Source for Next Generation MEMS Deep Si Etching: Minimal Tilt, Improved Profile Uniformity and Higher Etch Rates, SPP Process Technology Systems. 2010.
The International Search Report and the Written Opinion for International Application No. PCT/US2021/040380; dated Oct. 27, 2021; 10 pages.
International Search Report and Written Opinion dated Feb. 4, 2022 for Application No. PCT/US2021/054806.
International Search Report and Written Opinion dated Feb. 4, 2022 for Application No. PCT/US2021/054814.
U.S. Appl. No. 17/346,103, filed Jun. 11, 2021.
U.S. Appl. No. 17/349,763, filed Jun. 16, 2021.
U.S. Appl. No. 63/242,410, filed Sep. 9, 2021.
U.S. Appl. No. 17/410,803, filed Aug. 24, 2021.
U.S. Appl. No. 17/537,107, filed Nov. 29, 2021.
U.S. Appl. No. 17/352, 165, filed Jun. 18, 2021.
U.S. Appl. No. 17/352,176, filed Jun. 18, 2021.
U.S. Appl. No. 17/337,146, filed Jun. 2, 2021.
U.S. Appl. No. 17/361,178, filed Jun. 28, 2021.
U.S. Appl. No. 63/210,956, filed Jun. 15, 2021.
U.S. Appl. No. 17/475,223, filed Sep. 14, 2021.
U.S. Appl. No. 17/537,314, filed Nov. 29, 2021.
Chinese Office Action for 201880053380.1 dated Dec. 2, 2021.
Taiwan Office Action for 108132682 dated Mar. 24, 2022.

* cited by examiner

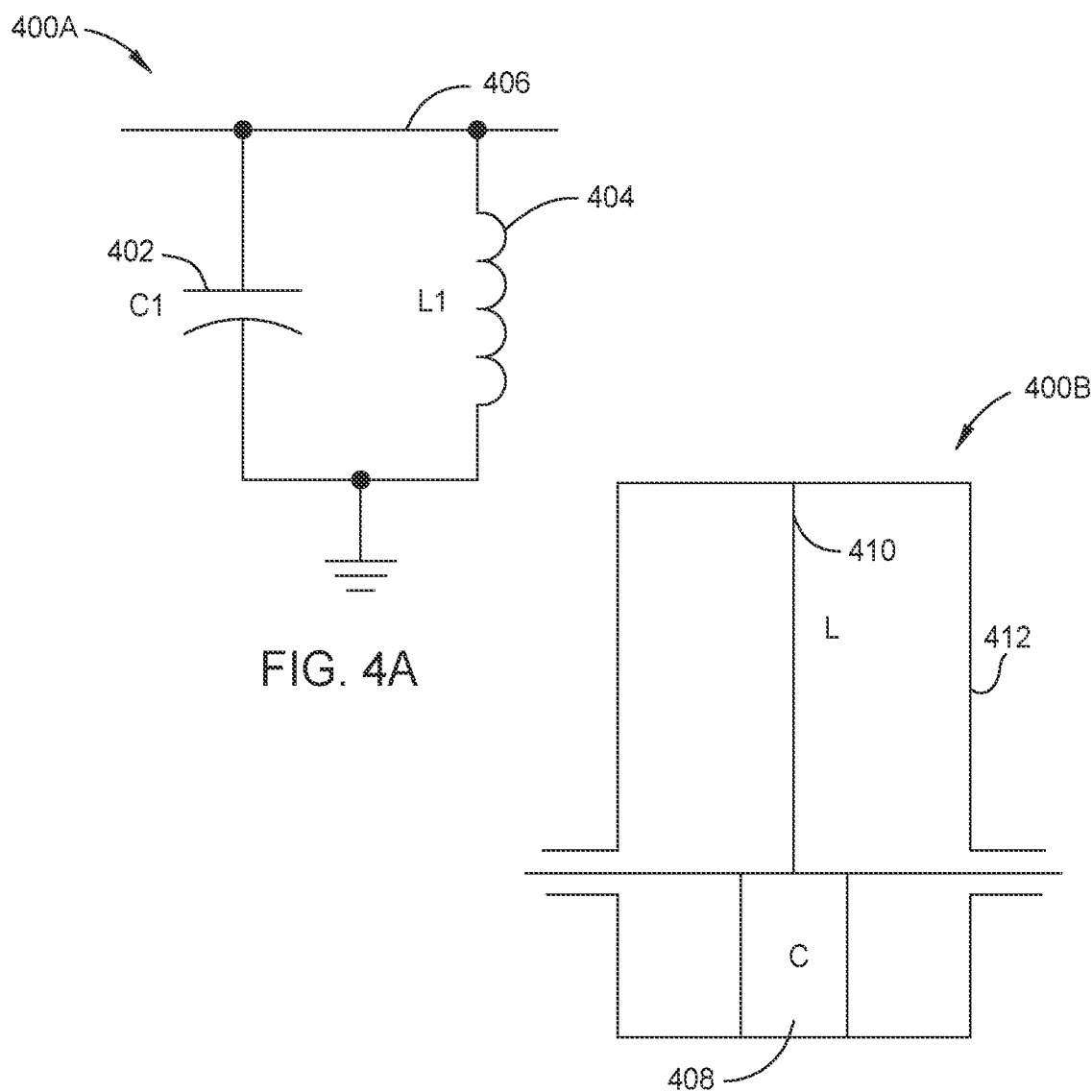
FIG. 4A
FIG. 4B
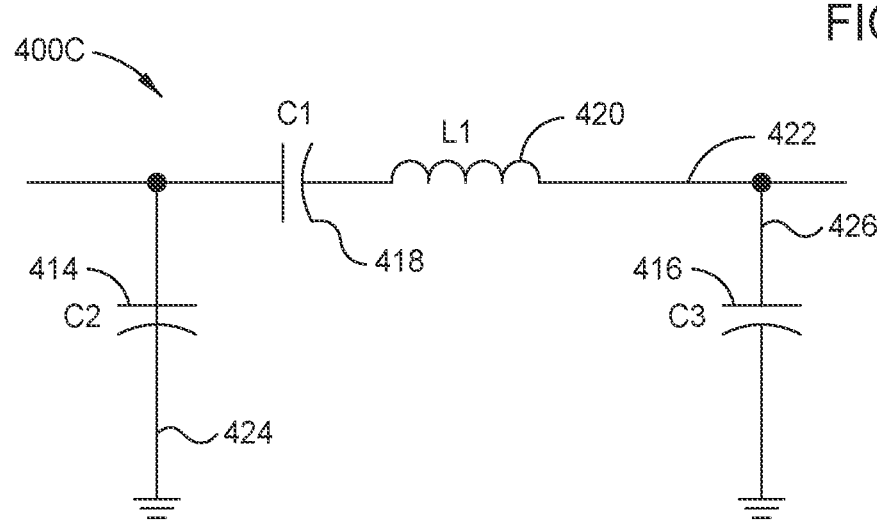
FIG. 4C

DISTORTION CURRENT MITIGATION IN A RADIO FREQUENCY PLASMA PROCESSING CHAMBER

BACKGROUND

Field

Embodiments of the present disclosure generally relate to a system used in semiconductor device manufacturing. More specifically, embodiments of the present disclosure relate to a plasma processing system used to process a substrate.

Description of the Related Art

Reliably producing high aspect ratio features is one of the key technology challenges for the next generation of semiconductor devices. One method of forming high aspect ratio features uses a plasma-assisted etching process in which a plasma is formed in a processing chamber and ions from the plasma are accelerated towards a surface of a substrate to form openings in a material layer disposed beneath a mask layer formed on the surface of the substrate.

In a typical plasma-assisted etching process, the substrate is positioned on a substrate support disposed in a processing chamber, a plasma is formed over the substrate, and ions are accelerated from the plasma towards the substrate across a plasma sheath, i.e., region depleted of electrons, formed between the plasma and the surface of the substrate.

In certain cases, plasma processing may use a combination of input powers with different frequencies, for example, a low frequency pulsed voltage signal (e.g., at 100 kHz to 5 MHz) and a high frequency radio frequency (RF) signal (e.g., at 10 MHz to 200 MHz). The plasma and the oscillating sheath may constitute a nonlinear load, which may generate distortion currents from the input powers. The distortion currents may include sidebands of an RF signal, such as a band of frequencies higher or lower than the frequency of the RF signal. For example, if a high RF frequency f1 provided by a first source and a low pulsed voltage signal frequency f2 provided by a second source are used, the distortion currents may include the sum and/or difference of f1 and f2, resulting in sideband frequencies f1−f2 and f1+f2 that are close to the frequency f1. In certain cases, the distortion currents may include harmonic distortions. For example, if square pulse waveforms and tailored waveforms are used, a sum of harmonic frequencies associated with the waveforms can contribute to the sidebands. The distortion currents may travel back to the power source (e.g., an RF signal generator) manifesting as reflected power. A signal filter may be arranged at the output the RF signal generator to protect the RF signal generator from the low frequency bias power provided in the pulse voltage signal generated from the low frequency source. The signal filter may not be able to block all of the reflected distortion currents coming back from the plasma load. RF reflected powers may be monitored and trigger the system safety interlock loop to protect against sudden abnormal changes in a process chamber. Such safety measures may interrupt the substrate processing operations. In certain cases, the reflected power can damage the power source and/or other electrical components. In certain cases, the reflected power can also affect the results of substrate processing.

Accordingly, there is a need in the art for plasma processing and biasing methods that are able to mitigate the effect of distortion currents on plasma-assisted etching process results and plasma-assisted etching hardware.

SUMMARY

Embodiments provided herein generally include apparatus, plasma processing systems and methods for generation of a waveform for plasma processing of a substrate in a processing chamber.

One embodiment of the present disclosure is directed to a plasma processing system. The plasma processing system generally includes a voltage source coupled to an input node, which is coupled to an electrode disposed within a processing chamber, wherein the voltage source is configured to generate a pulsed voltage signal at the input node; a radio frequency (RF) signal generator having an output, wherein the RF signal generator is configured to deliver a first RF signal at a first RF frequency to the input node; a bandpass filter coupled between the output of the RF signal generator and the input node, wherein the bandpass filter is configured to attenuate second RF signals that are outside a range of frequencies that include the first RF frequency of the first RF signal; and an impedance matching circuit coupled between the bandpass filter and the input node.

One embodiment of the present disclosure is directed to a plasma processing system. The plasma processing system generally includes a voltage source coupled to an input node coupled to an electrode disposed within a processing chamber, wherein the voltage source is configured to generate a pulsed voltage signal at the input node; a RF signal generator having an output, wherein the RF signal generator is configured to generate the RF signal overlaid on the pulsed voltage signal at the input node; and an RF circulator coupled between the output of the RF signal generator and the input node. The plasma processing system further includes a memory and a processor coupled to the memory. The process and the memory are configured to monitor a power of signals reflected from the processing chamber at the RF circulator, and stop generation of the RF signal at the RF signal generator if the monitored power is greater than or equal to a threshold for a duration.

One embodiment of the present disclosure is directed to a method of processing a substrate. The method generally includes generating, by a voltage source, a pulsed voltage signal at an input node coupled to an electrode disposed within a processing chamber; and delivering, by a signal generator, a first RF signal through at least a bandpass filter to the input node, wherein: the first RF signal comprises a first RF frequency, the bandpass filter is disposed between the RF signal generator and the input node, an impedance matching circuit is disposed between the bandpass filter and the input node, and the bandpass filter is configured to attenuate second RF signals that are outside of a range of frequencies including the first RF frequency of the first RF signal.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope and may admit to other equally effective embodiments.

FIGS. 4A-4C are diagrams of example bandpass filters.

To facilitate understanding, identical reference numerals have been used, where possible, to designate identical elements that are common to the figures. It is contemplated that elements disclosed in one aspect may be beneficially utilized on other aspects without specific recitation.

DETAILED DESCRIPTION

With technology node advancing towards 2 nm, fabrication of smaller features with larger aspect ratios involve atomic precision for plasma processing. For etching processes where the plasma ions play an important role, ion energy control is challenging the semiconductor equipment industry. Traditionally, RF biased techniques use a sinusoidal wave to excite plasma and accelerate ions.

Some embodiments of the present disclosure are generally directed to techniques and apparatus for mitigation of distortion currents reflected back to signal source(s) from a complex plasma load. For example, a bandpass filter can be arranged between an output of a radio frequency (RF) signal generator and the plasma load. In certain aspects, tuning of the RF signal generator and/or bandpass filter may be used to increase the input power to the plasma load and/or attenuate the distortion currents from the plasma load. For certain aspects, an RF circulator can may be arranged between the output of the RF signal generator and the plasma load to isolate the RF signal generator from the distortion currents. In some aspects, a bandpass filter, an RF match and a signal filter can be arranged in sequential order between an output of an RF signal generator and the plasma load.

The techniques and apparatus for distortion current mitigation described herein may protect certain electrical devices (e.g., signal sources) from electrical damage, enable substrate processing operations without interruptions due to reflected powers, and/or facilitate higher energy substrate processing operations.

Plasma Processing System Examples

Figure 1:
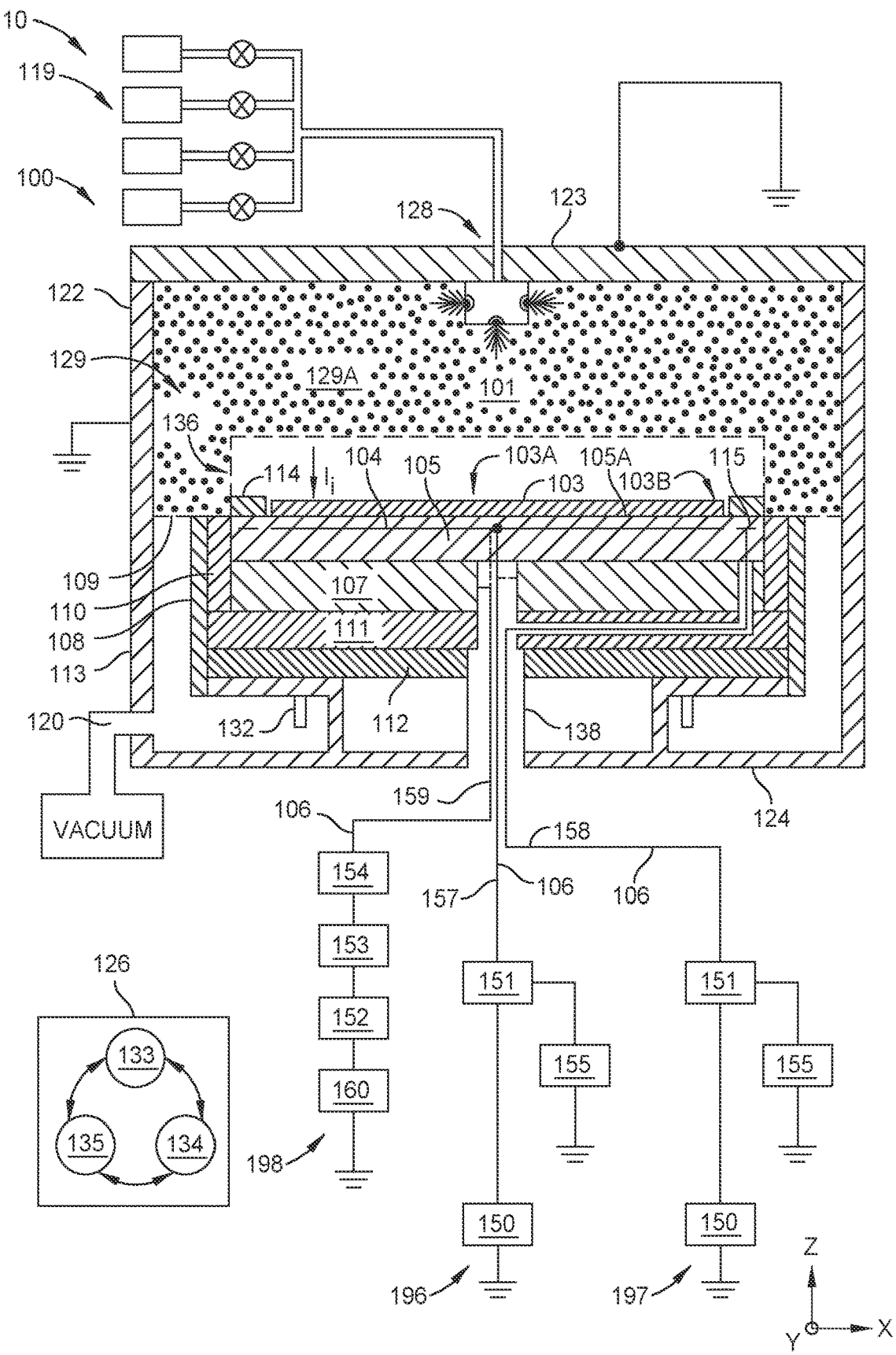
FIG. 1 is a schematic cross-sectional view of a processing system, according to one or more embodiments, configured to practice the methods set forth herein.

FIG. 1 is a schematic cross-sectional view of a plasma processing system 10 configured to perform one or more of the plasma processing methods set forth herein. In some embodiments, the processing system 10 is configured for plasma-assisted etching processes, such as a reactive ion etch (RIE) plasma processing. However, it should be noted that the embodiments described herein may be also be used with processing systems configured for use in other plasma-assisted processes, such as plasma-enhanced deposition processes, for example, plasma-enhanced chemical vapor deposition (PECVD) processes, plasma-enhanced physical vapor deposition (PEPVD) processes, plasma-enhanced atomic layer deposition (PEALD) processes, plasma treatment processing or plasma-based ion implant processing, for example, plasma doping (PLAD) processing.

As shown, the processing system 10 is configured to form a capacitively coupled plasma (CCP), where the processing chamber 100 include an upper electrode (e.g., chamber lid 123) disposed in a processing volume 129 facing a lower electrode (e.g., the substrate support assembly 136) also disposed in the processing volume 129. In a typical capacitively coupled plasma (CCP) processing system, a radio frequency (RF) source is electrically coupled to one of the upper or lower electrode delivers an RF signal configured to ignite and maintain a plasma (e.g., the plasma 101), which is capacitively coupled to each of the upper and lower electrodes and is disposed in a processing region therebetween. Typically, the opposing one of the upper or lower electrodes is coupled to ground or to a second RF power source for additional plasma excitation. As shown, the processing system 10 includes a processing chamber 100, a support assembly 136, and a system controller 126.

The processing chamber 100 typically includes a chamber body 113 that includes the chamber lid 123, one or more sidewalls 122, and a chamber base 124, which collectively define the processing volume 129. The one or more sidewalls 122 and chamber base 124 generally include materials that are sized and shaped to form the structural support for the elements of the processing chamber 100 and are configured to withstand the pressures and added energy applied to them while a plasma 101 is generated within a vacuum environment maintained in the processing volume 129 of the processing chamber 100 during processing. In one example, the one or more sidewalls 122 and chamber base 124 are formed from a metal, such as aluminum, an aluminum alloy, or a stainless steel alloy.

A gas inlet 128 disposed through the chamber lid 123 is used to deliver one or more processing gases to the processing volume 129 from a processing gas source 119 that is in fluid communication therewith. A substrate 103 is loaded into, and removed from, the processing volume 129 through an opening (not shown) in one of the one or more sidewalls 122, which is sealed with a slit valve (not shown) during plasma processing of the substrate 103.

In some embodiments, a plurality of lift pins (not shown) movably disposed through openings formed in the substrate support assembly 136 are used to facilitate substrate transfer to and from a substrate supporting surface 105A. In some embodiments, the plurality of lift pins 132 are disposed above and are coupled to and/or are engageable with a lift pin hoop (not shown) disposed in the processing volume 129. The lift pin hoop may be coupled to a shaft (not shown) that sealingly extends through the chamber base 124. The shaft may be coupled to an actuator (not shown) that is used to raise and lower the lift pin hoop. When the lift pin hoop is in a raised position, it engages with the plurality of lift pins 132 to raise the upper surfaces of the lift pins above the substrate supporting surface 105A, lifting the substrate 103 therefrom and enabling access to a non-active (backside)

surface the substrate 103 by a robot handler (not shown). When the lift pin hoop is in a lowered position, the plurality of lift pins 132 are flush with or recessed below the substrate supporting surface 105A, and the substrate 103 rests thereon.

The system controller 126, also referred to herein as a processing chamber controller, includes a central processing unit (CPU) 133, a memory 134, and support circuits 135. The system controller 126 is used to control the process sequence used to process the substrate 103, including performing certain aspects of the distortion current mitigation as further described herein. The CPU 133 is a general-purpose computer processor configured for use in an industrial setting for controlling the processing chamber and sub-processors related thereto. The memory 134 described herein, which is generally non-volatile memory, may include random access memory, read-only memory, floppy or hard disk drive, or other suitable forms of digital storage, local or remote. The support circuits 135 are conventionally coupled to the CPU 133 and comprise cache, clock circuits, input/output subsystems, power supplies, and the like, and combinations thereof. Software instructions (program) and data can be coded and stored within the memory 134 for instructing a processor within the CPU 133. A software program (or computer instructions) readable by CPU 133 in the system controller 126 determines which tasks are performable by the components in the processing system 10.

Typically, the program, which is readable by CPU 133 in the system controller 126, includes code, which, when executed by the processor (CPU 133), performs tasks relating to the plasma processing schemes described herein. The program may include instructions that are used to control the various hardware and electrical components within the processing system 10 to perform the various process tasks and various process sequences used to implement the methods described herein. In one embodiment, the program includes instructions that are used to perform one or more of the operations described below in relation to FIG. 6 and/or FIG. 8.

Figure 2A:
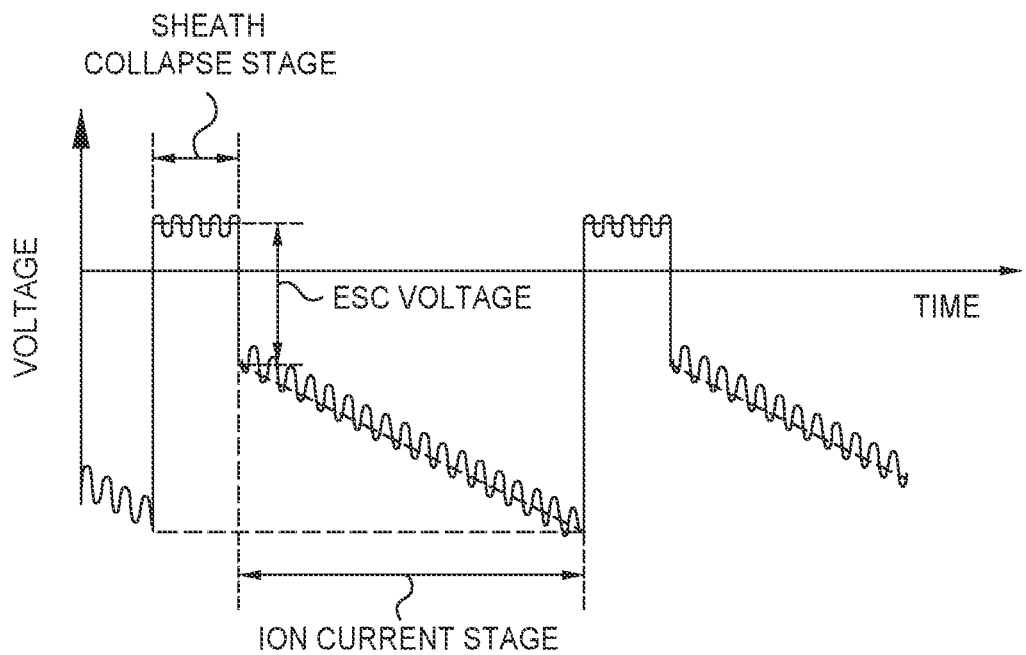
FIG. 2A shows a voltage waveform that may be applied to an electrode of a processing chamber, according to one or more embodiments.
Figure 2B:
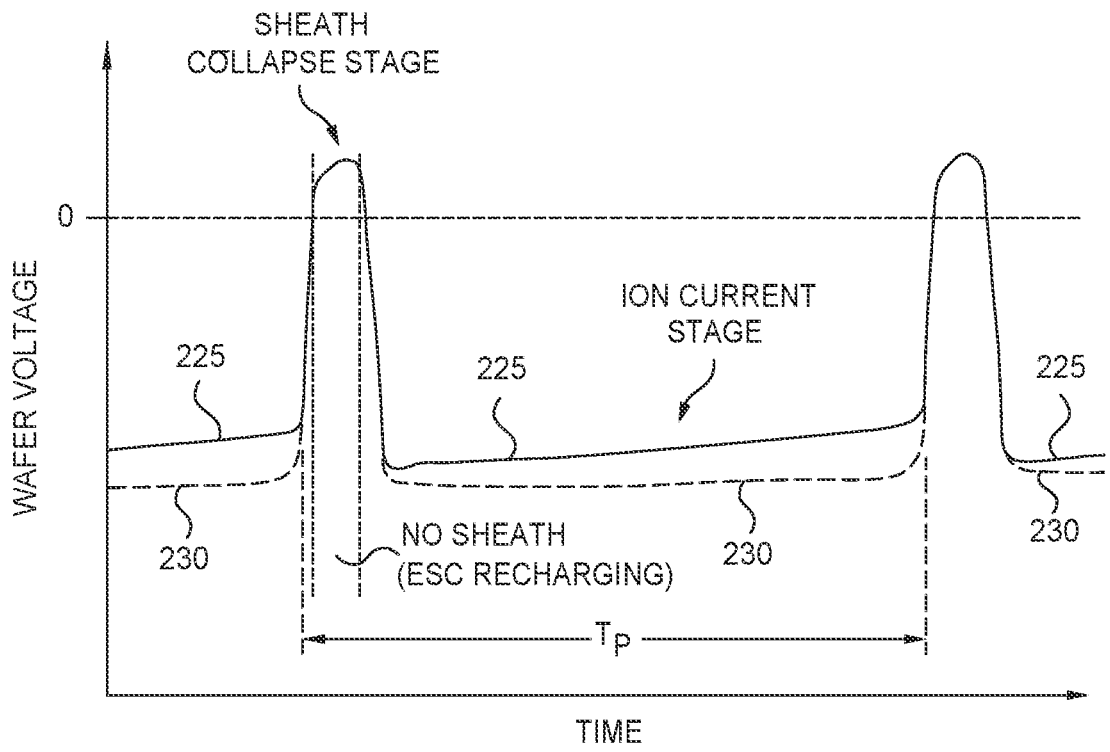
FIG. 2B shows a voltage waveform that is established on a substrate due to a voltage waveform applied to an electrode of a processing chamber.

The plasma control system generally includes a first source assembly 196 for establishing at least a first pulsed voltage (PV) waveform at a bias electrode 104 (on a complex load as depicted in FIG. 4), and a second source assembly 197 for establishing at least a second PV waveform at an edge control electrode 115. The first PV waveform or the second PV waveform may be generated using one or more components (e.g., PV sources) within a waveform generator assembly 150, which may correspond to a voltage source and/or current source as described in more detail herein with respect to FIG. 4. In some embodiments, the waveform generator assembly 150 is configured to generate pulsed voltage (PV) waveform, wherein the PV waveform is a non-sinusoidal voltage pulse. FIGS. 2A and 2B illustrate examples of a typical PV waveforms that are generated at an electrode and substrate, respectively, and may be used in conjunction with one or more embodiments of the disclosure provided herein. In one example, the waveform generator assembly 150 is configured to deliver PV pulses at frequencies between about 100 kHz to 400 kHz and voltages between about 100 volts and 10,000 volts.

In some embodiments, as shown in FIG. 1, a separate waveform generator assembly 160 within a third source assembly 198 includes at least an RF signal generator that is configured to deliver an RF signal to the support base 107 (e.g., power electrode or cathode) and/or bias electrode 104. In some embodiments, the waveform generator assembly 160 delivers an RF signal to the support base 107 (e.g., power electrode or cathode) and/or bias electrode 104, and thus may be used to generate (maintain and/or ignite) a plasma 101 in a processing region disposed between the substrate support assembly 136 and the chamber lid 123. In some embodiments, the third source assembly 198 may alternately be coupled to the chamber lid 123, such as in place of the ground shown in FIG. 1.

For certain aspects, a distortion current manager 152, impedance matching circuit 153, and/or a signal filter 154 may be arranged between the waveform generator assembly 160 within the third source assembly 198 and the support base 107 (e.g., power electrode or cathode) and/or bias electrode 104. In some embodiments in which the waveform generator assembly 160 is configured to generate an RF signal and a waveform generator assembly 150 is configured to generate a lower frequency signal, the signal filter 154 is a high-pass filter that is configured to allow a signal provided from the waveform generator assembly 160 to be delivered through the signal filter 154 and to the support base 107 and/or bias electrode 104. The support base 107, bias electrode 104, and/or edge control electrode 115 may be collectively and/or individually referred to as an input node of the processing chamber 100. In this example, the impedance matching circuit 153 may be arranged between the distortion current manager 152 and the signal filter 154.

The distortion current manager 152 may be configured to block and/or attenuate the distortion currents reflected back to the waveform generator assembly 160 from the plasma load. For example, the distortion current manager 152 may include a bandpass filter and/or an RF circulator as further described herein.

The impedance matching circuit 153 may be configured to match the input impedance of the input node. For example, the output impedance of the waveform generator assembly 150 may be matched via the impedance matching circuit 153 to the input impedance of the input node. The impedance matching circuit 153 may enable efficient transfer of power from the waveform generator assembly 160 to the input node.

The signal filter 154 may be configured to allow the RF signal generated by the waveform generator assembly 160 to travel to the input node. In certain aspects, the signal filter 154 may include a high pass filter. The signal filter 154 may isolate the waveform generator assembly 160 of the third source assembly 198 from the low frequency signals generated by the other waveform generator assemblies 150 of the first source assembly 196 and/or the second source assembly 197.

The applied waveforms provided from the first source assembly 196, the second source assembly 197 and/or the third source assembly 198 may be configured to generate (maintain and/or ignite) a plasma 101 in a processing region disposed between the substrate support assembly 136 and the chamber lid 123. In some embodiments, the RF signal provided from the waveform generator assembly 160 is used to ignite and maintain a processing plasma 101 using the processing gases disposed in the processing volume 129 and fields generated by the RF power (RF signal) delivered to the support base 107 and/or bias electrode 104. In some aspects, the RF signal may be generated by an RF signal generator (not shown) disposed within the waveform generator assembly 160. In some embodiments, the RF signal generator of the waveform generator assembly 160 may be configured to deliver an RF signal having a frequency that is greater than 1 MHz and/or between 2 MHz and 200 MHz, such as 13.56 MHz, 40 MHz, 60 MHz, 120 MHz, or 162 MHz.

The processing volume 129 is fluidly coupled to one or more dedicated vacuum pumps through a vacuum outlet 120, which maintain the processing volume 129 at sub-atmospheric pressure conditions and evacuate processing and/or other gases, therefrom. In some embodiments, the substrate support assembly 136, disposed in the processing volume 129, is disposed on a support shaft 138 that is grounded and extends through the chamber base 124.

The substrate support assembly 136, as briefly discussed above, generally includes the substrate support 105 (e.g., an electrostatic chuck (ESC) substrate support) and support base 107. In some embodiments, the substrate support assembly 136 can additionally include an insulator plate 111 and a ground plate 112, as is discussed further below. The support base 107 is electrically isolated from the chamber base 124 by the insulator plate 111, and the ground plate 112 is interposed between the insulator plate 111 and the chamber base 124. The substrate support 105 is thermally coupled to and disposed on the support base 107. In some embodiments, the support base 107 is configured to regulate the temperature of the substrate support 105, and the substrate 103 disposed on the substrate support 105, during substrate processing. In some embodiments, the support base 107 includes one or more cooling channels (not shown) disposed therein that are fluidly coupled to, and in fluid communication with, a coolant source (not shown), such as a refrigerant source or water source having a relatively high electrical resistance. In some embodiments, the substrate support 105 includes a heater (not shown), such as a resistive heating element embedded in the dielectric material thereof. Herein, the support base 107 is formed of a corrosion-resistant thermally conductive material, such as a corrosion-resistant metal, for example aluminum, an aluminum alloy, or a stainless steel and is coupled to the substrate support with an adhesive or by mechanical means.

Typically, the substrate support 105 is formed of a dielectric material, such as a bulk sintered ceramic material, such as a corrosion-resistant metal oxide or metal nitride material, for example, aluminum oxide ($Al_2O_3$), aluminum nitride (AlN), titanium oxide (TiO), titanium nitride (TiN), yttrium oxide ($Y_2O_3$), mixtures thereof, or combinations thereof. In embodiments herein, the substrate support 105 further includes the bias electrode 104 embedded in the dielectric material thereof.

In one configuration, the bias electrode 104 is a chucking pole used to secure (i.e., chuck) the substrate 103 to the substrate supporting surface 105A of the substrate support 105 and to bias the substrate 103 with respect to the processing plasma 101 using one or more of the pulsed-voltage biasing schemes described herein. Typically, the bias electrode 104 is formed of one or more electrically conductive parts, such as one or more metal meshes, foils, plates, or combinations thereof.

In some embodiments, the bias electrode 104 is electrically coupled to a clamping network, or high voltage DC supply 312 (FIG. 3), which provides a chucking voltage thereto, such as static DC voltage between about −5000 V and about 5000 V, using an electrical conductor, such as the coaxial power delivery line 106 (e.g., a coaxial cable). The clamping network includes a DC power supply 155 (e.g., a high voltage DC (HVDC) supply) and a filter 151 (e.g., a low-pass filter).

The substrate support assembly 136 may further include the edge control electrode 115 that is positioned below the edge ring 114 and surrounds the bias electrode 104 and/or is disposed a distance from a center of the bias electrode 104. In general, for a processing chamber 100 that is configured to process circular substrates, the edge control electrode 115 is annular in shape, is made from a conductive material, and is configured to surround at least a portion of the bias electrode 104. In some embodiments, such as shown in FIG. 1, the edge control electrode 115 is positioned within a region of the substrate support 105. In some embodiments, as illustrated in FIG. 1, the edge control electrode 115 includes a conductive mesh, foil, and/or plate that is disposed a similar distance (i.e., Z-direction) from the substrate supporting surface 105A of the substrate support 105 as the bias electrode 104.

The edge control electrode 115 can be biased by use of a waveform generator assembly that is different from the waveform generator assembly 150, which is used to bias the bias electrode 104. In some embodiments, the edge control electrode 115 can be biased by use of a waveform generator assembly 150 that is also used to bias the bias electrode 104 by splitting part of the power to the edge control electrode 115. In one configuration, a first waveform generator assembly 150 of the first source assembly 196 is configured to bias the bias electrode 104, and a second waveform generator assembly 150 of a second source assembly 197 is configured to bias the edge control electrode 115.

In one embodiment, a power delivery line 157 electrically connects the output of the waveform generator assembly 150 of the first source assembly 196 to the bias electrode 104. While the discussion below primarily discusses the power delivery line 157 of the first source assembly 196, which is used to couple a waveform generator assembly 150 to the bias electrode 104, the power delivery line 158 of the second source assembly 197, which couples a waveform generator assembly 150 to the edge control electrode 115, and/or the power delivery line 159 of the third source assembly 198, which couples a waveform generator 160 to the support base 107, will include the same or similar components. The electrical conductor(s) within the various parts of the power delivery line 157 may include: (a) one or a combination of coaxial cables, such as a flexible coaxial cable that is connected in series with a rigid coaxial cable, (b) an insulated high-voltage corona-resistant hookup wire, (c) a bare wire, (d) a metal rod, (e) an electrical connector, or (f) any combination of electrical elements in (a)-(e).

In some embodiments, the processing chamber 100 further includes the quartz pipe 110, or collar, that at least partially circumscribes portions of the substrate support assembly 136 to prevent the substrate support 105 and/or the support base 107 from contact with corrosive processing gases or plasma, cleaning gases or plasma, or byproducts thereof. Typically, the quartz pipe 110, the insulator plate 111, and the ground plate 112 are circumscribed by a liner 108 (e.g., a cathode liner). In some embodiments, a plasma screen 109 is positioned between the cathode liner 108 and the sidewalls 122 to prevent plasma from forming in a volume underneath the plasma screen 109 between the liner 108 and the one or more sidewalls 122.

FIG. 2A shows an example voltage waveform that may be established at an electrode or input node (e.g., the bias electrode 104 and/or support base 107) of a processing chamber. FIG. 2B illustrates an example of different types of voltage waveforms 225 and 230 established at a substrate due to different voltage waveforms, similar to the voltage waveform shown in FIG. 2A, that are separately established at an electrode within the processing chamber. The waveforms include two stages: an ion current stage and a sheath collapse stage, as shown. As illustrated in FIG. 2A, the example voltage waveform may include a pulsed voltage signal (e.g., a pulsed signal at 100 kHz to 5 MHz with a duty cycle ranging from 5% to 95%) overlaid with an RF signal (e.g., a sinusoidal high frequency signal at a frequency greater than 10 MHz). For current compensation (e.g., during the ion current stage), the example voltage waveform shown in FIG. 2A may also include a voltage ramp with a negative slope overlaid with the RF signal. At the beginning of the ion current stage, a drop in substrate voltage creates a high voltage sheath above the substrate, accelerating positive ions to the substrate.

The positive ions that bombard the surface of the substrate during the ion current stage deposit a positive charge on the substrate surface, which if uncompensated causes a gradually increasing substrate voltage during the ion current stage, as illustrated by voltage waveform 225 in FIG. 2B. However, the uncontrolled accumulation of positive charge on the substrate surface undesirably gradually discharges the sheath and chuck capacitors, slowly decreasing the sheath voltage drop and bringing the substrate potential closer to zero, as illustrated by voltage waveform 225. The accumulation of positive charge results in the voltage droop in the voltage waveform established at the substrate (FIG. 2B). However, a voltage waveform that is established at the electrode that has a negative slope during the ion current stage, as shown in FIG. 2A, can be desirably generated so as to establish a square shaped region (e.g., near zero slope) for an established substrate voltage waveform, as shown by curve labelled 230 in FIG. 2B. Implementing the slope in the waveform established at the electrode during the ion current stage (FIG. 2A) may be referred to as ion current compensation. The voltage difference between the beginning and end of the ion current phase determines an ion energy distribution function (IEDF) width. The greater the voltage difference, the wider the IEDF width, which is undesirable in most current high precision plasma processes. To achieve monoenergetic ions and a narrower IEDF width, operations are performed to flatten the substrate voltage waveform in the ion current phase using the ion current compensation.

Distortion Current Mitigation for Substrate Processing

Certain embodiments of the present disclosure are generally directed to techniques and apparatus for mitigation of distortion currents reflected from the plasma load to a signal source of a plasma processing system.

Figure 3:
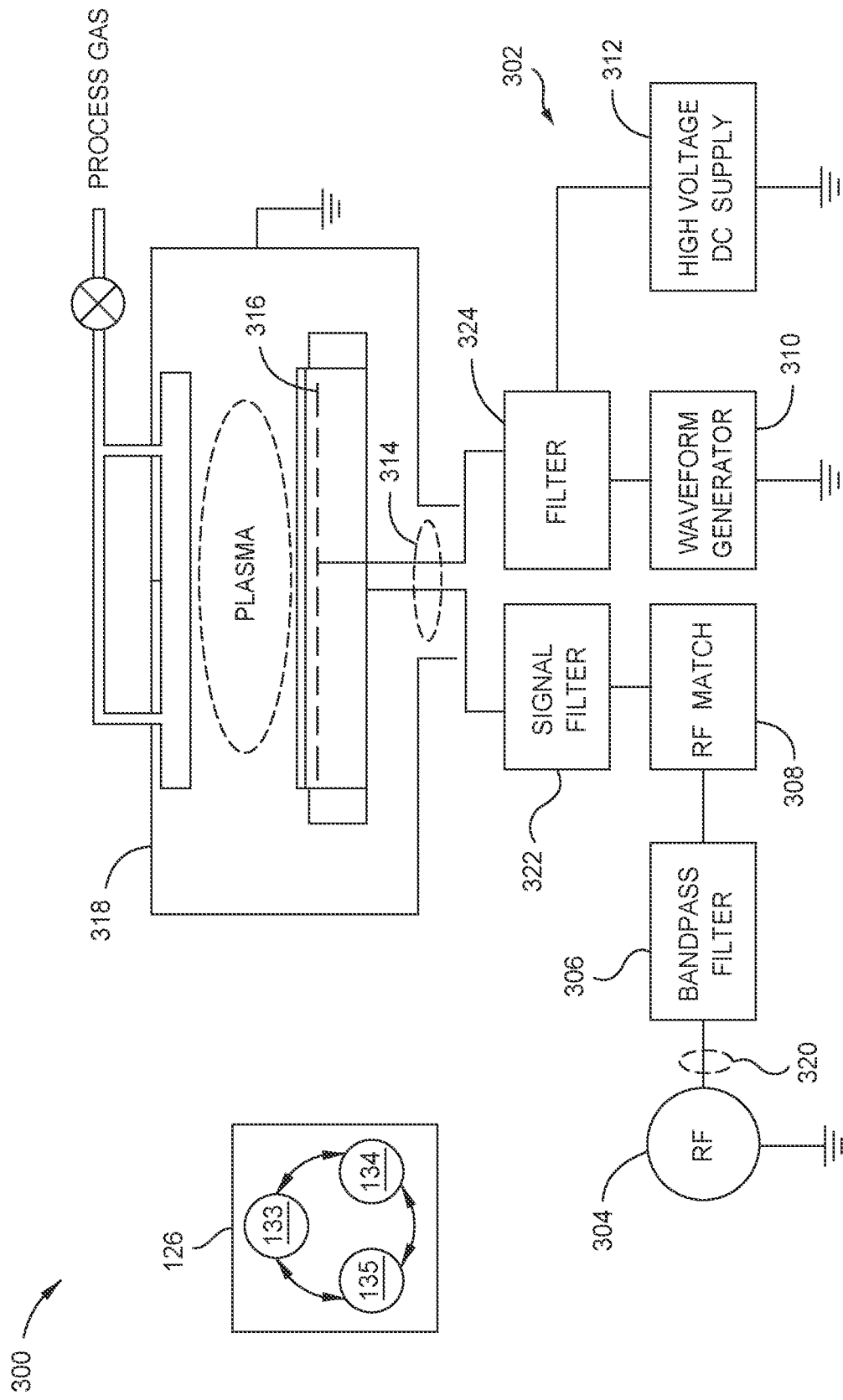
FIG. 3 is a diagram illustrating an example plasma processing system employing a bandpass filter for distortion current mitigation.

In certain aspects, the distortion current manager may employ a bandpass filter to attenuate the distortion currents. FIG. 3 is a diagram illustrating an example plasma processing system 300 employing a bandpass filter 306 for distortion current mitigation, in accordance with certain aspects of the present disclosure. The plasma processing system 300 may depict an example of the processing system 10. As shown, the plasma processing system 300 may include a voltage source 302 (e.g., the waveform generator assemblies 150 of the first and second source assemblies 196, 197), an RF generator 304 (e.g., the waveform generator assembly 160 of the third source assembly 198), a bandpass filter 306 (e.g., the distortion current manager 152), and an impedance matching circuit 308 (e.g., the impedance matching circuit 153).

The voltage source 302 may include a waveform generator 310, which may generate the pulsed voltage signal, and an HVDC supply 312, which may provide the DC bias for the voltage waveform. The voltage source 302 may be coupled to an input node 314, which may be coupled to an electrode 316 (e.g., the support base 107 and/or bias electrode 104) disposed within a processing chamber 318 (e.g., the processing chamber 100). The voltage source 302 may be configured to generate a pulsed voltage signal (e.g., a pulsed signal at 100 kHz to 5 MHz with a duty cycle ranging from 5% to 95%) at the input node 314.

The RF generator 304 may have an output 320 coupled to the input node 314 through at least the bandpass filter 306 and impedance matching circuit 308. The RF generator 304 may generate a first RF signal overlaid on the pulsed voltage signal at the input node 314, for example, as described herein with respect to FIGS. 1 and 2A. The first RF signal may have at least one first RF frequency, such as a frequency that is greater than 1 MHz and/or between 1 MHz and 200 MHz, such as 13.56 MHz, 40 MHz, 60 MHz, 120 MHz, or 162 MHz. The RF generator 304 may be referred to as an RF plasma generator or an RF signal generator.

The bandpass filter 306 may be coupled between the output 320 of the RF generator 304 and the input node 314. The bandpass filter 306 may prevent or attenuate harmful reflected power signals from damaging the RF generator 304. For example, the bandpass filter 306 may be configured to attenuate the distortion currents reflected back to the RF generator 304 from the plasma load in the processing chamber 318. The bandpass filter 306 may have a high quality factor (e.g., a quality factor greater than or equal to fifty) with low insertion loss. The bandpass filter 306 may have a narrow bandwidth (e.g., measured at half power points or cut off frequencies) of ±0.1% to ±0.5% from the center frequency of the bandpass filter 306. A bandwidth of ±0.1% to ±0.5% from the center frequency may represent a bandwidth of 0.2% to 1% of the center frequency, where the lower cutoff frequency is −0.1% to −0.5% from the center frequency, and the higher cutoff frequency is 0.1% to 0.5% from the center frequency, for example. For example, the bandwidth of the bandpass filter 306 may be from 100 kHz to 800 kHz. The bandpass filter 306 may be configured to attenuate second RF signals (e.g., the distortion currents described herein) that are outside a range of frequencies (e.g., a bandwidth of ±0.1% to ±0.5% from the center frequency of the bandpass filter 306) including the first RF frequency of the first RF signal.

The impedance matching circuit 308 may be coupled between the bandpass filter 306 and the input node 314. The output impedance of the RF generator 304 and/or bandpass filter 306 may be matched via the impedance matching circuit 308 to the input impedance of the input node 314.

In certain aspects, a signal filter 322 (e.g., the signal filter 154) may be disposed between the impedance matching circuit 308 and the input node 314. The signal filter 322 may isolate the RF generator 304 from the pulsed signal generated by the voltage source 302. A low pass filter 324 (e.g., the filter 151) may be coupled between the voltage source 302 and the input node 314. The low pass filter 324 may isolate the voltage source 302 from the RF signal generated by the RF generator 304.

The processing chamber 318 may include a substrate support that comprises a dielectric layer disposed over the electrode 316, for example, as described herein with respect to FIG. 1. The plasma processing system 300 may also include the system controller 126, which may perform one or more of the operations described herein with respect to FIG. 6 and/or FIG. 8.

FIGS. 4A-4C are diagrams illustrating examples of bandpass filters for mitigation of distortion currents. The bandpass filter(s) depicted in FIGS. 3A-3C may be examples of the bandpass filter 306 depicted in FIG. 3. In certain cases, the bandpass filter(s) depicted in FIGS. 4A-4C may include lumped electrical components. The bandpass filters can be configured to allow RF signals at frequencies greater than 1 MHz, such as greater than 10 MHz, or greater than 60 MHz, or even greater than 100 MHz to pass therethrough.

Referring to FIG. 4A, a bandpass filter 400A may include a capacitor 402 and an inductor 404 coupled in parallel along a signal line 406, which may representative of the power delivery line 159. The inductor 404 may have an inductance of 0.1 pH to 5 pH, and the capacitor may have a capacitance of 3 pF to 100 pF, for example. The bandpass filter 400A may provide various advantages and/or benefits, such as being low cost, and having a small footprint.

For certain aspects, the bandpass filter may include a distributed-element filter. Referring to FIG. 4B, a bandpass filter 400B may include a vacuum capacitor 408 coupled in parallel with a transmission line inductor 410 to the inner surface of a metal enclosure 412. The metal enclosure 412 may be coupled to the shielding of an RF coaxial cable (e.g., the power delivery line 159), which may provide an RF return path. The inductance of the distributed inductor 410 may vary with the conductor length, which may be shorter than a quarter wavelength of the RF signal, for example. In certain embodiments, the vacuum capacitor 408 may include a motorized vacuum capacitor to adjust the center frequency of the bandpass filter 400B. In other words, the bandpass filter 400B may include a tunable element, such as a tunable capacitor. The tunable bandpass filter 400B can be tuned such that the center frequency of the bandpass filter 400B matches the output frequency used by the RF signal generator (e.g., the RF generator 304 depicted in FIG. 3). The bandpass filter 400B may provide various advantages and/or benefits, such as offering less filter-to-filter variation and improved control over the frequency accuracy for the center frequency and/or cutoff frequencies.

For certain aspects, the bandpass filter may employ multiple reactive components, which may facilitate a narrow bandwidth and high quality factor. Referring to FIG. 4C, a bandpass filter 400C may include a first shunt capacitor 414, a second shunt capacitor 416, and a third capacitor 418 coupled in series with an inductor 420 along a signal line 422, which may be representative of the power delivery line 159. The third capacitor 418 and the inductor 420 may be coupled between the first shunt capacitor 414 and the second shunt capacitor 416. The shunt capacitors 414, 416 may be coupled along separate shunt branches 424, 426, respectively, from the signal line 422. As an example, the inductor 420 may have an inductance of 0.1 pH to 5 pH. The first and second shunt capacitors 414, 416 may each have a capacitance of 200 pF to 1000 pF, and the third capacitor 418 may have a capacitance of 3 pF to 100 pF. The first, second, third capacitors 414, 416, 418 may have a fixed or tunable capacitance, such as a motorized vacuum capacitor. As a tunable filter, the center frequency of the bandpass filter 400C can be tuned to match the output frequency of the RF signal generator (e.g., the RF generator 304 depicted in FIG. 3). The bandpass filter 400C may provide various advantages and/or benefits, such as providing desirable filter performance with a narrow bandwidth and high quality factor.

Figure 5:
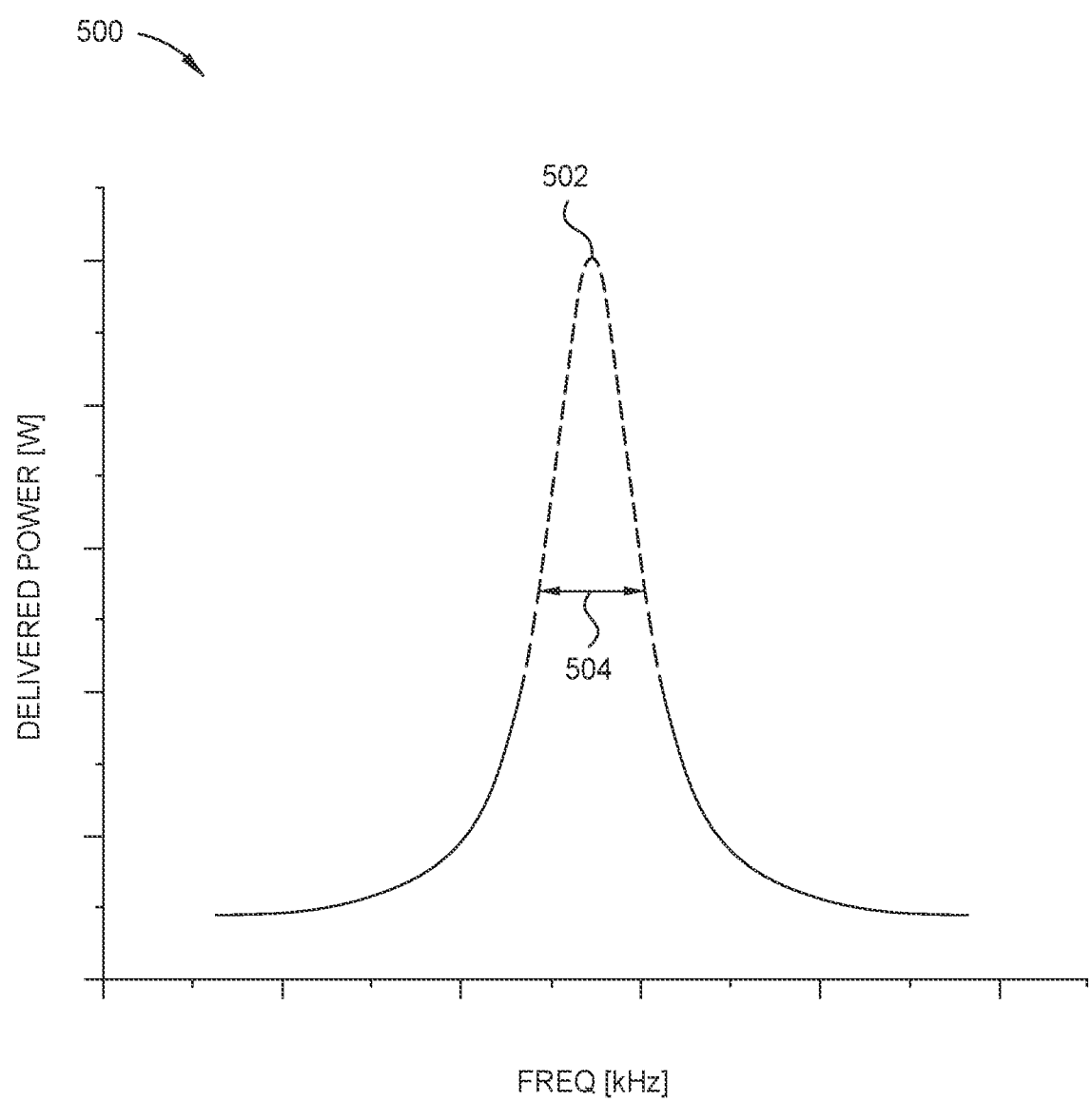
FIG. 5 is a graph of a frequency response of an example bandpass filter.

FIG. 5 is a graph of an example frequency response 500 of a bandpass filter for distortion current mitigation, in accordance with certain aspects of the present disclosure. The frequency response 500 shows the output power of the bandpass filter versus frequency. In this example, the frequency response may have a center frequency 502, which may match the output frequency of the signal generator, and a bandwidth 504, which may be ±0.1% to ±0.5% from the center frequency 502. In aspects, the bandwidth 504 may be determined at half power points from the power of the center frequency 502.

Figure 6:
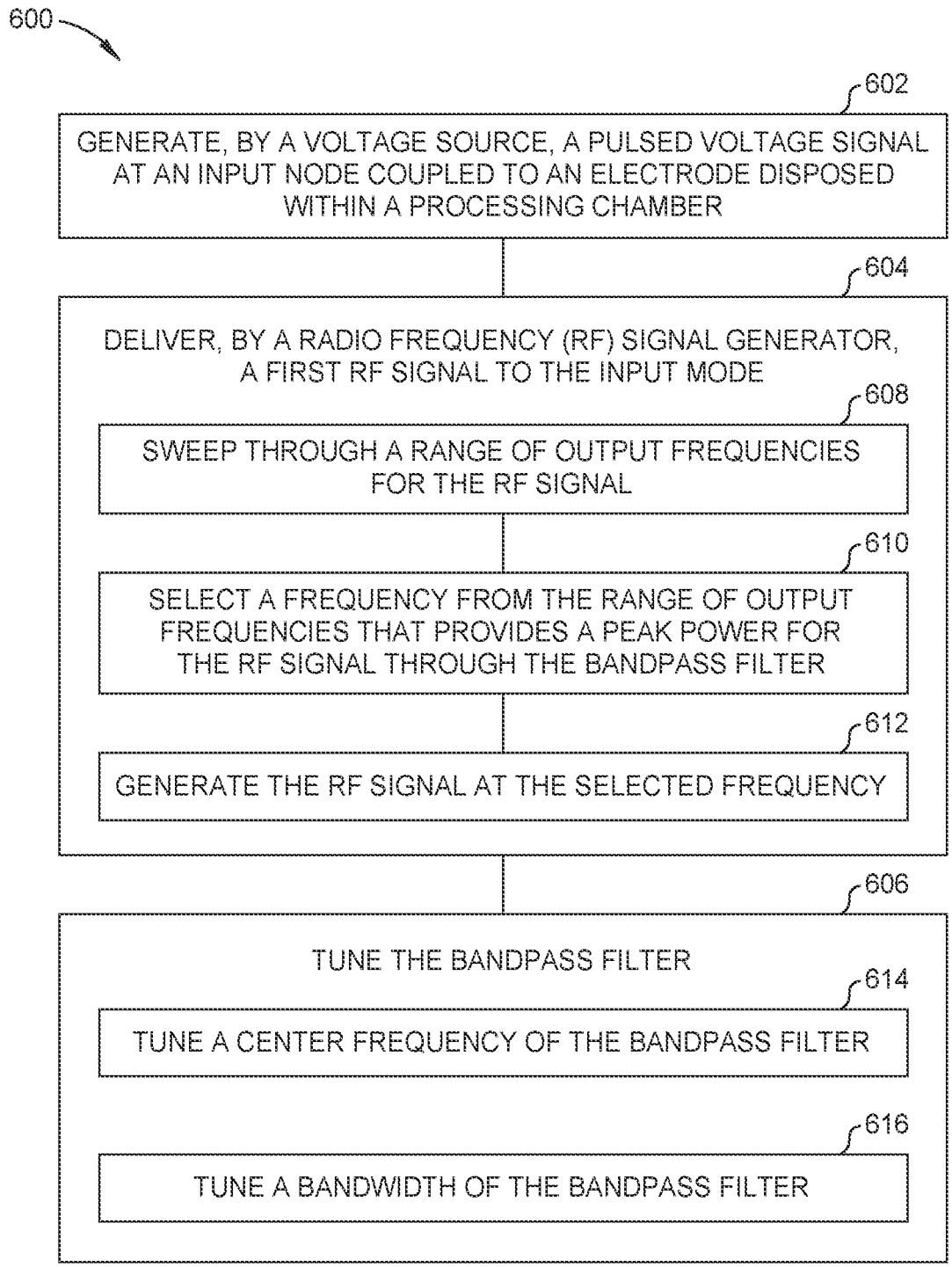
FIG. 6 is a process flow diagram illustrating a method for distortion current mitigation using a bandpass filter.

FIG. 6 is a process flow diagram illustrating a method 600 for distortion current mitigation using a bandpass filter. The method 600 may be performed by a plasma processing system, such as the processing system 10.

At activity 602, a voltage source (e.g., the voltage source 302) may generate a pulsed voltage signal at an input node (e.g., the input node 314) coupled to an electrode (e.g., the support base 107 and/or bias electrode 104) disposed within a processing chamber (e.g., the processing chamber 100, 318). For example, the voltage source may generate the pulsed voltage signal as described herein with respect to FIG. 2A. The pulsed voltage signal may be pulsed at a frequency of 100 kHz to 5 MHz with a duty cycle ranging from 5% to 95%.

At activity 604, an RF signal generator (e.g., the RF generator 304) may deliver a first RF signal at a first RF frequency (and/or other RF frequencies) to the input node. The RF signal generate may generate the first RF signal overlaid on the pulsed voltage signal through at least a bandpass filter (e.g., the bandpass filter 306). For example, the RF signal may be overlaid on the pulsed voltage signal as described herein with respect to FIG. 2A. The bandpass filter may be disposed between the RF signal generator and the input node. An impedance matching circuit (e.g., the impedance matching circuit 308) may be disposed between the bandpass filter and the input node. The bandpass filter may be configured to attenuate second RF signals (e.g., distortion currents from the plasma load) that are outside of a range of frequencies (e.g., ±0.1% to ±0.5% from the output frequency of the RF signal generator) including the first RF frequency of the first RF signal.

In certain aspects, the output frequency of the RF signal generator may be tuned to improve the power delivered to the plasma load and/or improve the attenuation of the distortion currents. At activity 608, the RF signal generator may sweep through a range of output frequencies for the RF signal, where the RF signal generator is configured to sweep through the range of output frequencies. At activity 610, a processor and memory (e.g., the system controller 126) may select a frequency from the range of output frequencies that provides a peak power for the RF signal through the bandpass filter. At activity 612, the RF signal generator may generate the RF signal at the selected frequency. In some embodiments, the frequency tuning may start after pulsed voltage waveforms or tailored voltage waveforms are applied to the plasma chamber. In other embodiments, the frequency tuning may start before the pulsed voltage waveforms or tailored voltage waveforms are applied to the plasma chamber. The frequency tuning may continue until a minimum reflected power and/or maximum of delivered power is achieved. The frequency scan range can be from 0.1% to 1% of an initial output frequency. Frequency tuning may enable the distortion current mitigation to compensate for bandpass filter performance variations, for example, due to impedance variations in the components of the bandpass filter. Due to component impedance variations, the center frequency of the bandpass filter may be offset from the designed value, and the RF signal generator then adjusts its output frequency to match the center frequency of the bandpass filter. The frequency tuning scan can compensate center frequency shifts by changing the output frequency of the RF signal generator frequency to the actual center frequency.

In certain aspects, the bandpass filter may be tuned to improve the power delivered to the plasma load and/or improve the attenuation of the distortion currents. At activity 606, the bandpass filter may be tuned.

At activity 614, the center frequency (e.g., the center frequency 502) of the bandpass filter may be tuned. For example, the center frequency of the bandpass filter may be adjusted until the center frequency matches the output frequency of the RF signal generator. In certain cases, the center frequency may be adjusted until a maximum delivered power at the plasma load is observed. The center frequency of the bandpass filter may be tuned with at least one capacitor (e.g., the third capacitor 418) of the bandpass filter to match the output frequency of the first RF signal allowing a peak power for the first RF signal at the output frequency. For example, a range of center frequencies may be set for the bandpass filter, and the center frequency that provides the maximum power delivered may be considered the peak power for the RF signal. In some embodiment of activity 614, the capacitance of a variable capacitor (e.g., motorized vacuum capacitor) is adjusted in order to change the center frequency of the bandpass filter. FIGS. 4A-C illustrate various configurations of the bandpass filter that can be tuned in order to desirably match the frequency setpoint of the RF generator. As an example, referring to FIG. 4C, the capacitance of the third capacitor 418 may be adjusted to tune the center frequency of the bandpass filter 400C.

At activity 616, the bandwidth (e.g., the bandwidth 504) of the bandpass filter may be tuned. The bandwidth of the bandpass filter may be tuned attenuate the second RF signals reflected from the processing chamber. For example, the bandwidth may be adjusted until a minimum reflected power from the plasma load is observed. The bandwidth may be adjusted to be within ±5% from the output frequency of the first RF signal, for example, after the center frequency is tuned. In certain aspects, tuning the bandpass filter may include adjusting the capacitance of at least one of the capacitors, such as the capacitors depicted in FIGS. 4A-4C. The bandpass filter may be tuned within 5% of a tuning range of the bandpass filter until a minimum reflected power and/or maximum delivered power is obtained. As an example, referring to FIG. 4C, the capacitance of the first capacitor 414 and/or the second capacitor 416 may be adjusted to tune the bandwidth of the bandpass filter 400C.

For certain aspects, the RF signal overlaid on the pulsed voltage signal may be used for plasma etching applications. For example, a plasma may be generated over a substrate supporting surface of a substrate support disposed in the processing chamber, as described herein with respect to FIG. 1. The substrate support may include the electrode and a dielectric layer disposed between the electrode and the substrate supporting surface.

Figure 7:
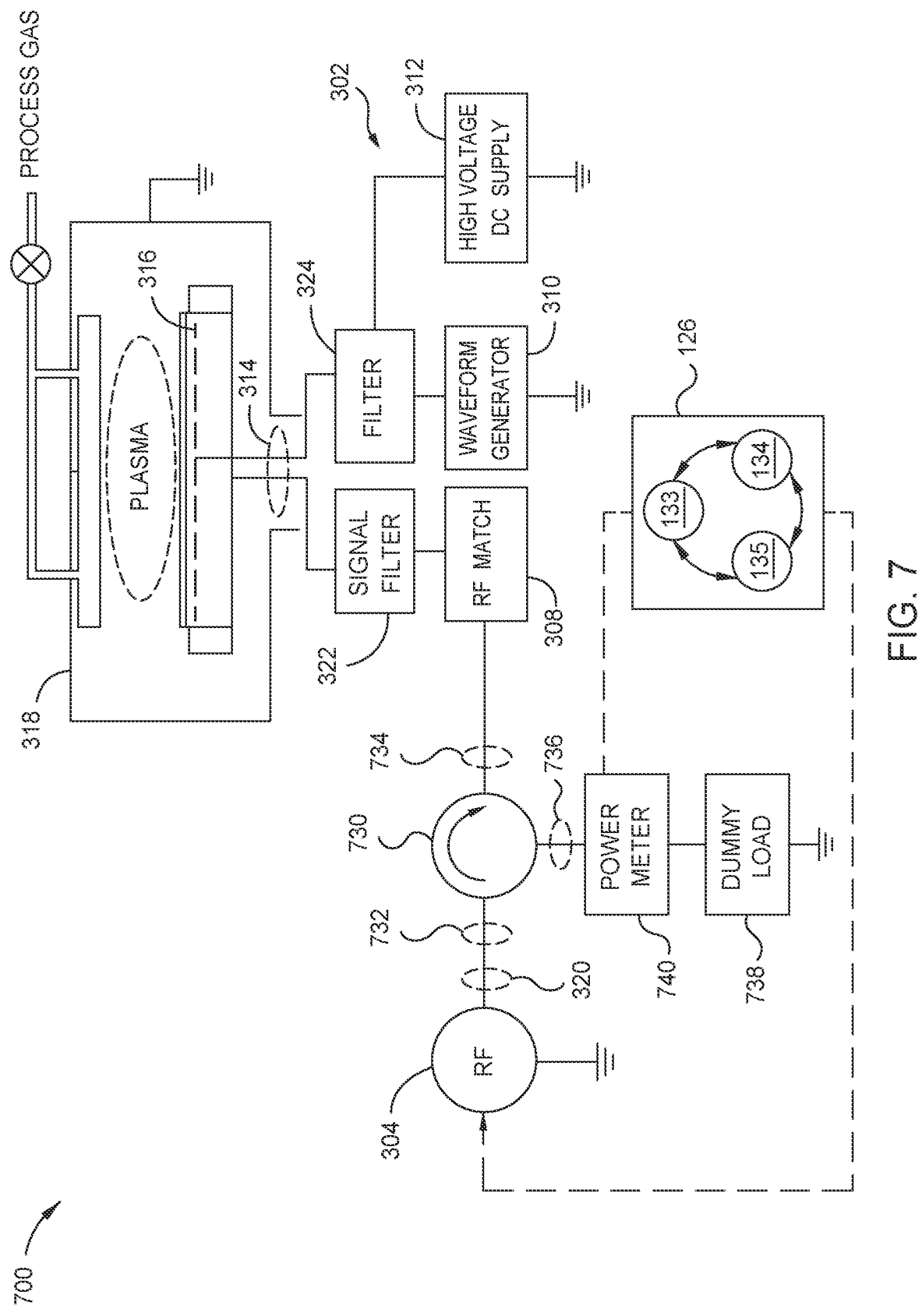
FIG. 7 is a diagram illustrating an example plasma processing system employing an RF circulator for distortion current mitigation.

In certain aspects, the distortion current manager may employ an RF circulator to isolate the RF signal generator from the distortion currents reflected from the plasma load. FIG. 7 is a diagram illustrating an example plasma processing system 700, in accordance with certain aspects of the present disclosure. The plasma processing system 700 may depict an example of the processing system 10. As shown, the plasma processing system 700 may include the voltage source 302, the RF generator 304, an RF circulator 730, and the system controller 126.

The RF circulator 730 may be disposed between the output 320 of the RF generator 304 and the input node 314. The RF circulator 730 may be configured to isolate the RF generator 304 from the distortion currents reflected back from the plasma load. The RF circulator 730 may include a first port 732, a second port 734, and a third port 736. The first port 732 may be coupled to the output 320 of the RF generator 304, the second port 734 may be coupled to at least the input node 314, and the third port 736 may be coupled to at least a dummy load 738. The RF circulator 730 may allow the RF signal from the RF generator 304 to travel from the first port 732 to the second port 734, but not the third port 736. The RF circulator may allow the distortion currents travelling towards the RF circulator 730 to travel from the second port 734 to the third port 736, but not the first port 732.

The system controller 126 may monitor power of signals reflected from the processing chamber 318 at the RF circulator 730 through the dummy load 738. For example, a power meter 740 may be coupled between the dummy load 738 and the third port 736 of the RF circulator 730. The system controller 126 may be in communication with the power meter 740 to receive the measured powers at the third port 736 of the RF circulator 730. The RF circulator 730 may direct reflected distortion currents to the dummy load 738, which may include a high power resistive load (e.g., 50 ohm). The system controller 126 may stop generation of the RF signal at the RF generator 304 if the monitored power is greater than or equal to a threshold for a specific duration (e.g., 5 seconds). In other words, the RF generator 304 may be shut off if the reflected distortion currents exceed a certain threshold power. Triggering the shut off of the RF generator 304 may prevent the distortion currents from damaging the signal generator 304, RF circulator 730 and/or other electrical components in the plasma processing system 700.

Figure 8:
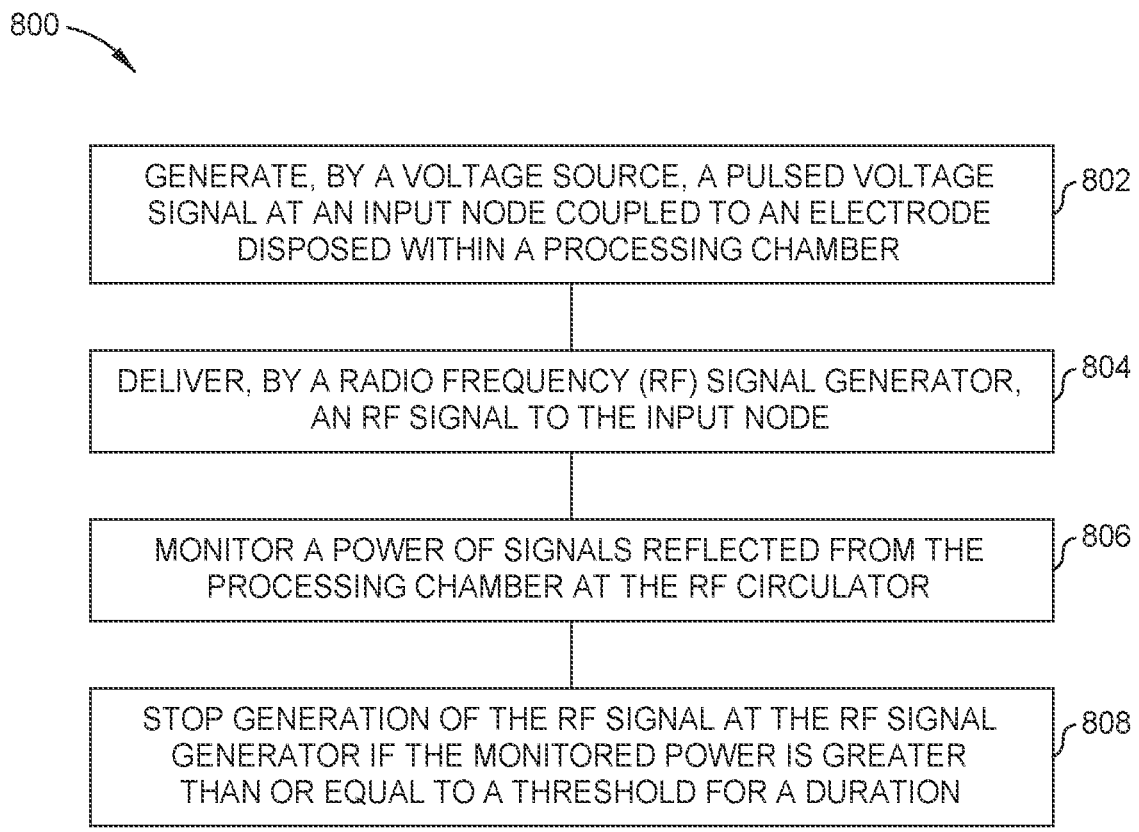
FIG. 8 is a process flow diagram illustrating a method for distortion current mitigation using a RF circulator.

FIG. 8 is a process flow diagram illustrating a method 800 for distortion current mitigation using an RF circulator. The method 800 may be performed by a plasma processing system, such as the processing system 10.

At activity 802, a voltage source (e.g., the voltage source 302) may generate a pulsed voltage signal at an input node (e.g., the input node 314) coupled to an electrode (e.g., the support base 107 and/or bias electrode 104) disposed within a processing chamber (e.g., the processing chamber 100, 318). For example, the voltage source may generate the pulsed voltage signal as described herein with respect to FIG. 2A.

At activity 804, an RF signal generator (e.g., the RF generator 304) may deliver an RF signal to the input node. The RF signal generator may generate an RF signal overlaid on the pulsed voltage signal (e.g., as described herein with respect to FIG. 2A) through at least an RF circulator (e.g., the RF circulator 730). For example, the RF signal generator may generate the RF signal overload on the pulsed voltage signal as described herein with respect to FIG. 2A.

At activity 806, a processor and memory (e.g., the system controller 126) may monitor a power of signals reflected from the processing chamber at the RF circulator, for example, as described herein with respect to FIG. 7.

At activity 808, the processor and memory may stop generation of the RF signal at the RF signal generator if the monitored power is greater than or equal to a threshold for a specific duration (e.g., 5 seconds), for example, as described herein with respect to FIG. 7.

Figure 9:
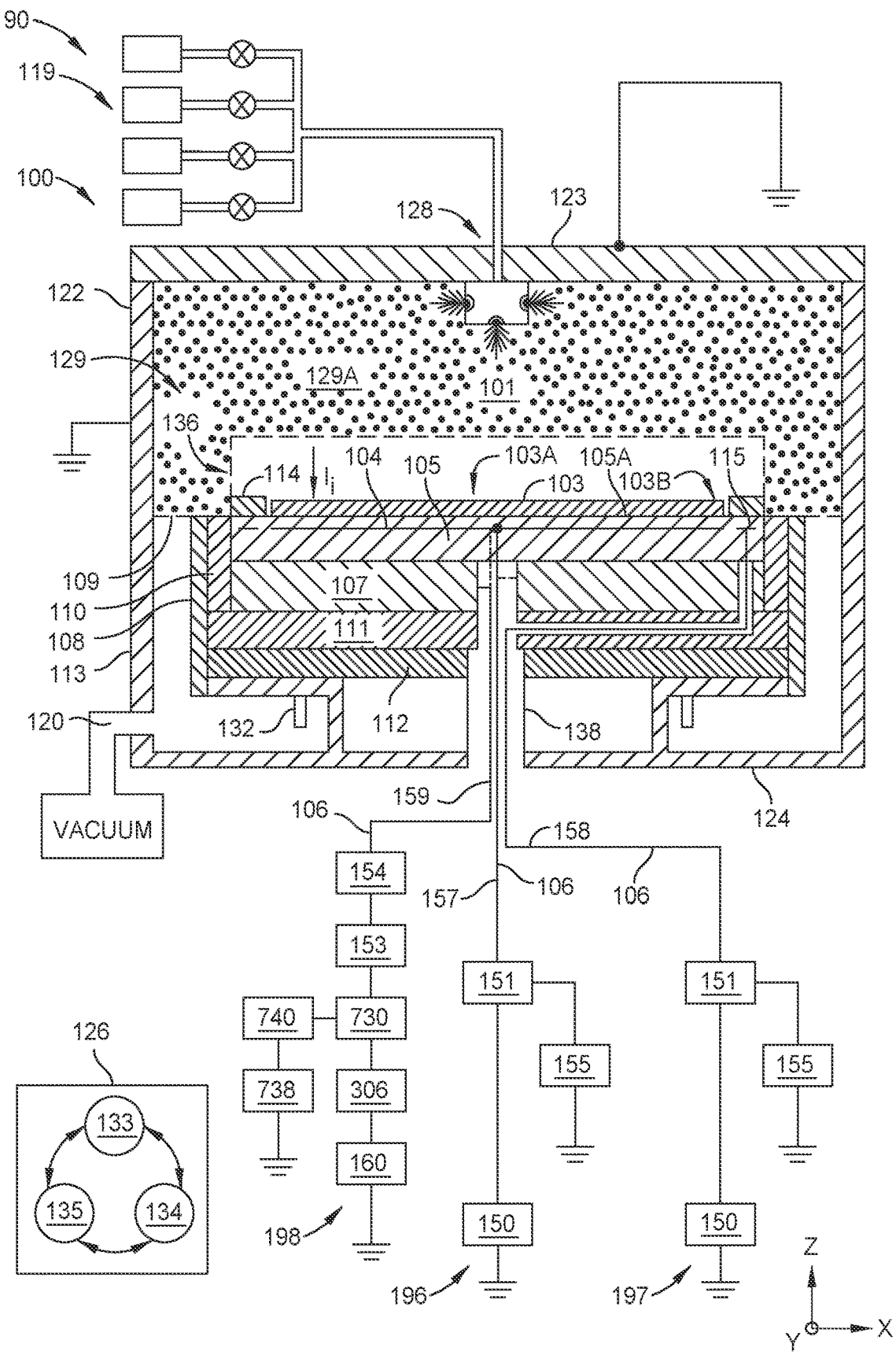
FIG. 9 is an example plasma processing system employing a bandpass filter and an RF circulator for distortion current mitigation.

In certain aspects, the distortion current manager may employ an RF circulator and a bandpass filter. FIG. 9 is a diagram illustrating an example of a plasma processing system 90 that includes the bandpass filter 306, the RF circulator 730, the dummy load 738, and the power meter 740 as described herein with respect to FIGS. 3 and 7. In one embodiment, as discussed above in conjunction with FIG. 7, the signals monitored by the system controller 126 and various controlling elements within the system controller 126 are used to adjust the center frequency and/or tune the bandpass filter, as discussed above in conjunction with activities 614 and 616 of method 600, to maximize the delivered power and/or attenuate the RF signals reflected from the processing chamber. Therefore, during plasma processing, if the system controller 126 detects an undesirable amount of reflected power making it through the bandpass filter and to the power meter 740 the system controller 126 will provide a signal that will cause components within the bandpass filter to be adjusted or tuned (e.g., adjust the capacitance in a bandpass filter 400A, 400B or 400C) to adjust the center frequency and/or tune the bandpass filter to minimize the amount of energy that is provided to the dummy load 738.

It will be appreciated that the techniques and apparatus described herein may protect certain electrical devices (e.g., the RF signal generator) from electrical damage, enable substrate processing operations without interruptions due to reflected powers, and/or facilitate higher energy substrate processing operations.

The term "coupled" is used herein to refer to the direct or indirect coupling between two objects. For example, if object A physically touches object B and object B touches object C, then objects A and C may still be considered coupled to one another—even if objects A and C do not directly physically touch each other. For instance, a first object may be coupled to a second object even though the first object is never directly physically in contact with the second object.

While the foregoing is directed to embodiments of the present disclosure, other and further embodiments of the disclosure may be devised without departing from the basic scope thereof, and the scope thereof is determined by the claims that follow.

What is claimed is:

1. A method of processing a substrate, comprising:
   generating, by a voltage source, a pulsed voltage signal at an input node coupled to an electrode disposed within a processing chamber; and
   delivering, by a radio frequency (RF) plasma generator, a first RF signal through at least a bandpass filter to the input node, wherein:
   the first RF signal comprises a first RF frequency,
   the bandpass filter is disposed between the RF plasma generator and the input node,
   an impedance matching circuit is disposed between the bandpass filter and the input node,
   the bandpass filter is configured to attenuate second RF signals that are outside of a range of frequencies that include the first RF frequency of the first RF signal; and
   tuning a center frequency of the bandpass filter with at least one capacitor to match the first RF frequency of the RF signal allowing a peak power for the first RF signal at the first RF frequency.

2. The method of claim 1, wherein a signal filter is disposed between the impedance matching circuit and the input node.

3. The method of claim 1, wherein the bandpass filter includes a capacitor and an inductor coupled in parallel.

4. The method of claim 1, wherein the bandpass filter includes a distributed-element filter.

5. The method of claim 1, wherein the bandpass filter includes a first shunt capacitor, a second shunt capacitor, and a capacitor coupled in series with an inductor, wherein the capacitor and the inductor are coupled between the first shunt capacitor and the second shunt capacitor.

6. The method of claim 1, wherein the bandpass filter has a quality factor greater than or equal to fifty.

7. The method of claim 1, further comprising tuning a bandwidth of the bandpass filter to attenuate the second RF signals reflected from the processing chamber, wherein tuning the bandwidth of the bandpass filter comprises adjusting the bandwidth to be within ±5% from the first RF frequency of the first RF signal.

8. The method of claim 1, wherein generating the RF signal comprises:
   sweeping through a range of output frequencies for the RF signal;
   selecting a frequency from the range of output frequencies that provides a peak power for the RF signal through the bandpass filter; and
   generating the RF signal at the selected frequency.

9. The method of claim 1, wherein generating the RF signal comprises generating the RF signal through at least an RF circulator and the bandpass filter.

10. The method of claim 9, further comprising:
    monitoring a power of signals reflected from the processing chamber at the RF circulator; and
    stopping generation of the RF signal if the monitored power is greater than or equal to a threshold for a duration.

11. A plasma processing system, comprising:
    a voltage source coupled to an input node, which is coupled to an electrode disposed within a processing chamber, wherein the voltage source is configured to generate a pulsed voltage signal at the input node;
    a radio frequency (RF) signal generator having an output, wherein the RF signal generator is configured to deliver a first RF signal at a first RF frequency to the input node;
    a bandpass filter coupled between the output of the RF signal generator and the input node, wherein the bandpass filter is configured to attenuate second RF signals that are outside a range of frequencies that include the first RF frequency of the first RF signal, wherein a center frequency of the bandpass filter is tuned with at least one capacitor to match the first RF frequency of the RF signal allowing a peak power for the first RF signal at the first RF frequency; and
    an impedance matching circuit coupled between the bandpass filter and the input node.

12. The plasma processing system of claim 11, further comprising a signal filter disposed between the impedance matching circuit and the input node.

13. The plasma processing system of claim 11, wherein the bandpass filter includes a capacitor and an inductor coupled in parallel.

14. The plasma processing system of claim 11, wherein the bandpass filter includes a distributed-element filter.

15. The plasma processing system of claim 11, wherein the bandpass filter includes a first shunt capacitor, a second shunt capacitor, and a capacitor coupled in series with an inductor, wherein the capacitor and the inductor are coupled between the first shunt capacitor and the second shunt capacitor.

16. The plasma processing system of claim 11, wherein the bandpass filter has a quality factor greater than or equal to fifty.

17. The plasma processing system of claim 11, wherein:
    the RF signal generator is configured to sweep through a range of output frequencies for the RF signal;

the plasma processing system further comprises:
a memory; and
a processor coupled to the memory, the processor and the memory being configured to select a frequency from the range of output frequencies that provides a peak power for the RF signal through the bandpass filter; and
wherein RF signal generator is configured to generate the RF signal at the selected frequency.

18. The plasma processing system of claim 11, further comprising:
a memory; and
a processor coupled to the memory, the memory including instructions that when executed by the processor is configured to:
monitor a power of signals reflected from the processing chamber at an RF circulator; and
stop generation of the RF signal at the RF signal generator if the monitored power is greater than or equal to a threshold for a duration.

19. A plasma processing system, comprising:
a voltage source coupled to an input node coupled to an electrode disposed within a processing chamber, wherein the voltage source is configured to generate a pulsed voltage signal at the input node;
a radio frequency (RF) signal generator having an output, wherein the RF signal generator is configured to generate a RF signal overlaid on the pulsed voltage signal at the input node;
an RF circulator coupled between the output of the RF signal generator and the input node;
a memory; and
a processor coupled to the memory, the processor and the memory being configured to:
monitor a power of signals reflected from the processing chamber at the RF circulator; and
stop generation of the RF signal at the RF signal generator if the monitored power is greater than or equal to a threshold for a duration.

\* \* \* \* \*